(12) United States Patent
Kim et al.

(10) Patent No.: US 10,624,248 B2
(45) Date of Patent: Apr. 14, 2020

(54) EMI SHIELDING STRUCTURE AND MANUFACTURING METHOD THEREFOR

(71) Applicant: Samsung Electronics Co., Ltd., Suwon-si, Gyeonggi-do (KR)

(72) Inventors: Kyong-il Kim, Seoul (KR); Keon Kuk, Yongin-si (KR); Il-ju Mun, Suwon-si (KR); O-hyun Beak, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 18 days.

(21) Appl. No.: 15/438,008

(22) Filed: Feb. 21, 2017

(65) Prior Publication Data

US 2017/0295679 A1  Oct. 12, 2017

Related U.S. Application Data

(60) Provisional application No. 62/320,062, filed on Apr. 8, 2016.

(30) Foreign Application Priority Data

Oct. 19, 2016  (KR) .......................... 10-2016-0135978

(51) Int. Cl.
*H05K 9/00* (2006.01)
*H05K 5/06* (2006.01)
(Continued)

(52) U.S. Cl.
CPC ..... *H05K 9/0088* (2013.01); *B29C 45/14639* (2013.01); *H05K 1/188* (2013.01);
(Continued)

(58) Field of Classification Search
CPC .................. H05K 9/0088; H05K 1/188; B29C 45/14639; B29L 2031/3425; B29K 2101/12
(Continued)

(56) References Cited

U.S. PATENT DOCUMENTS 6,092,281 A   7/2000  Glenn
7,633,015 B2  12/2009 Wurzel et al.
(Continued)

FOREIGN PATENT DOCUMENTS

CN    103563493 A    2/2014
JP    05-144858 A    6/1993
(Continued)

OTHER PUBLICATIONS

Chinese Office Action dated May 22, 2019, issued in Chinese Application No. 201780012468.4.
(Continued)

*Primary Examiner* — A. Dexter Tugbang
*Assistant Examiner* — Azm A Parvez
(74) *Attorney, Agent, or Firm* — Jefferson IP Law, LLP

(57) ABSTRACT

An electromagnetic interference (EMI) shielding structure and a method for manufacturing are provided. The EMI shielding structure includes a printed circuit board (PCB) on which a plurality of elements are mounted, an insulation molding member configured to cover the plurality of elements, a conductive shielding dam formed along a side surface of the insulation molding member, and a conductive shielding member formed on a top surface of the insulation molding member.

6 Claims, 24 Drawing Sheets

(51) Int. Cl.
*B29C 45/14* (2006.01)
*H05K 1/18* (2006.01)
*H05K 3/28* (2006.01)
*B29K 101/12* (2006.01)
*B29L 31/34* (2006.01)

(52) U.S. Cl.
CPC ........... *H05K 5/065* (2013.01); *H05K 9/0022* (2013.01); *B29K 2101/12* (2013.01); *B29L 2031/3425* (2013.01); *H01L 2224/16227* (2013.01); *H01L 2224/97* (2013.01); *H01L 2924/19105* (2013.01); *H01L 2924/3025* (2013.01); *H05K 3/284* (2013.01); *Y10T 29/49146* (2015.01)

(58) Field of Classification Search
USPC ......... 29/841, 832, 846, 848, 854, 855, 858; 174/523, 521, 377, 387, 384
See application file for complete search history.

(56) References Cited

U.S. PATENT DOCUMENTS

| | | | |
|---|---|---|---|
| 8,633,403 B2 | 1/2014 | Lin et al. | |
| 8,852,986 B2* | 10/2014 | Kuan | B29C 45/14655 257/667 |
| 8,881,387 B2 | 11/2014 | Lin et al. | |
| 2008/0217819 A1* | 9/2008 | Lee | B29C 37/0067 264/446 |
| 2012/0008288 A1 | 1/2012 | Tsukamoto et al. | |
| 2014/0055957 A1 | 2/2014 | Yang et al. | |
| 2014/0160699 A1* | 6/2014 | Zhang | H01L 23/552 361/752 |

FOREIGN PATENT DOCUMENTS

| | | |
|---|---|---|
| JP | 07-106789 A | 4/1995 |
| JP | 2014-183181 A | 9/2014 |
| KR | 10-2006-0100169 A | 9/2006 |
| KR | 10-1247343 B1 | 3/2013 |
| KR | 10-2013-0058292 A | 6/2013 |
| WO | 2012/170632 A2 | 12/2012 |
| WO | 2014/093035 A1 | 6/2014 |

OTHER PUBLICATIONS

Chinese Office Action dated Dec. 16, 2019, issued in Chinese Patent Application No. 201780012468.4.

* cited by examiner

FIG. 14A 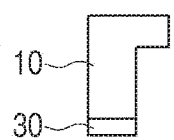 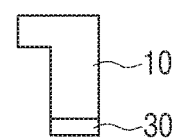

FIG. 15A 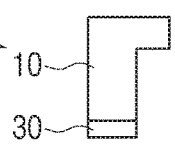 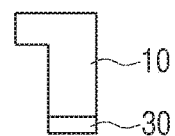

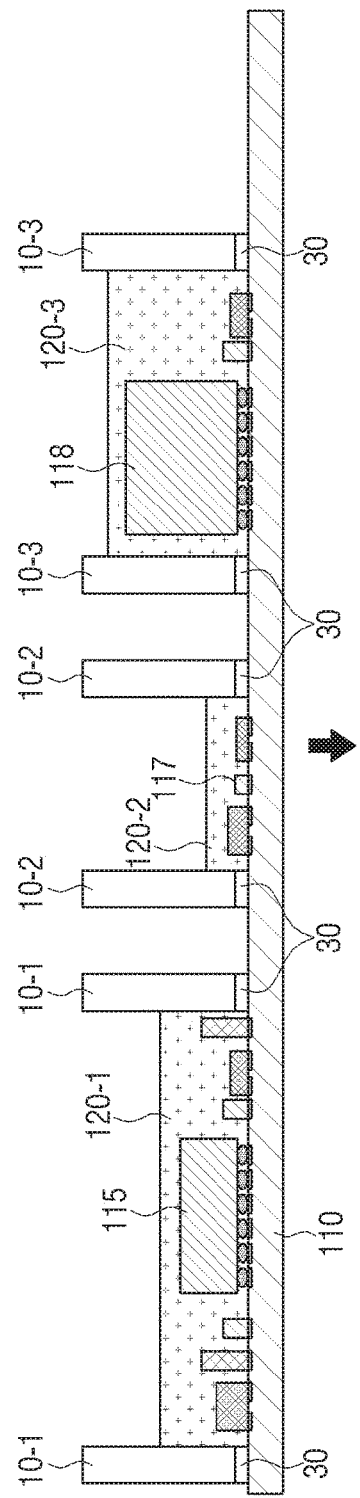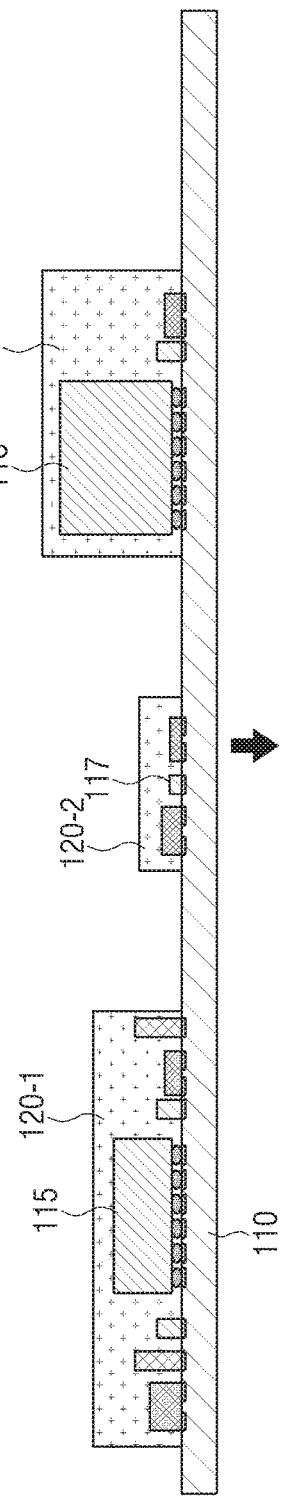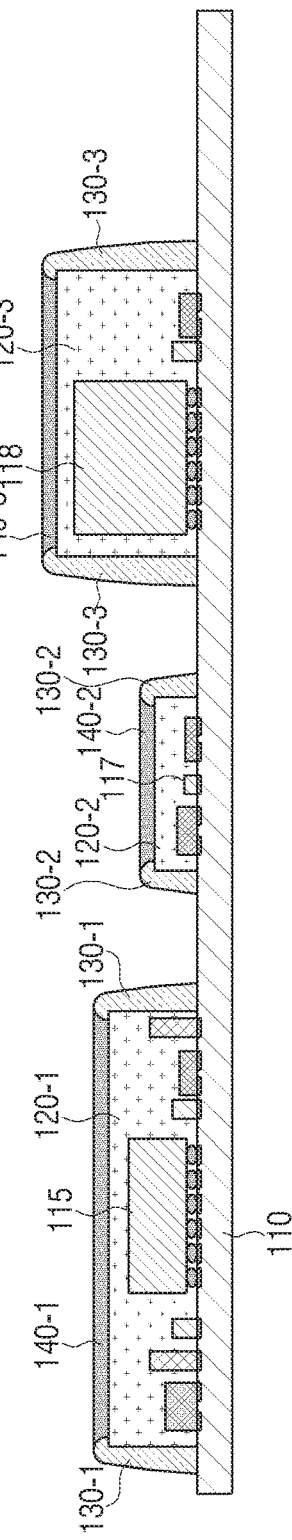

FIG. 19A 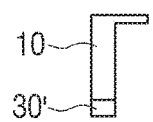 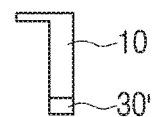

FIG. 20A 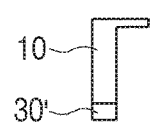 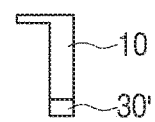

EMI SHIELDING STRUCTURE AND MANUFACTURING METHOD THEREFOR

CROSS-REFERENCE TO RELATED APPLICATION(S)

This application claims the benefit under 35 U.S.C. § 119(e) of a U.S. Provisional application filed on Apr. 8, 2016 in the U.S. Patent and Trademark Office and assigned Ser. No. 62/320,062, and under 35 U.S.C. § 119(a) of a Korean patent application filed on Oct. 19, 2016 in the Korean Intellectual Property Office and assigned Serial number 10-2016-0135978, the entire disclosure of each of which is hereby incorporated by reference.

TECHNICAL FIELD

The present disclosure relates to an electromagnetic interference (EMI) shielding structure and a method for manufacturing the EMI shielding structure. More particularly, the present disclosure relates to a method for manufacturing an EMI shielding structure, which forms an insulation molding member using a mold and forms a shielding material for covering the insulation molding member.

BACKGROUND

Currently, the demand for portable devices in electronic product markets is increasing, and also, there has been a continuous demand for miniaturizing and lightening of portable devices to make them easy to carry. In order to miniaturize and lighten portable devices, packaging technology for integrating a plurality of circuit elements mounted on a printed circuit board (PCB) into a single package, as well as technology for reducing the sizes of individual electronic components provided in the portable devices are essential. In particular, a semiconductor package which deals with high frequency signals advantageously includes various electromagnetic interference (EMI) shielding structures in order to improve implementation of EMI or electromagnetic wave resistance characteristics as well as aid in miniaturization.

To achieve this, a related-art EMI shielding structure includes a structure which covers various circuit elements with a shield can made of press-processed metal, and a structure which forms a shielding dam made of a conductive material to enclose circuit elements, covers all the circuit elements by injecting an insulator into the shielding dam, and then forms a shielding layer thereon.

In the shielding structure applying the shield can, the shield can should have a constant thickness to maintain its shape, and should be spaced from each circuit element by a predetermined distance to prevent a short from the circuit element. However, due to the thickness of the shield can and the distance between the shield can and the circuit element, there is a limit to reducing the height of the shield can. Such a limit may be a factor that hinders miniaturization of the shielding structure. In addition, an air gap is formed between the shield can and the circuit element. The air gap performs an insulation action for hindering heat emitted from the circuit element from being discharged. In order to emit heat smoothly, air vents should be formed on the upper portion or side portion of the shield can. However, since electromagnetic waves leak through the air vents formed on the shield can, there is a problem that the EMI shielding effect is reduced.

In addition, as the technology develops, high density mounting is increasingly used. In this case, since a gap between circuit elements is set to be very narrow, it is difficult to manufacture a shielding dam satisfying a required width to height ratio by a related-art process.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide an electromagnetic interference (EMI) shielding structure and a method for manufacturing the EMI shielding structure, which can be applied to a printed circuit board (PCB) in which circuit elements are high density mounted by forming a shielding dam, leaning on an insulation molding member for covering the circuit elements.

Another aspect of the present disclosure is to provide a mold sealing method which can prevent an insulation material injected into a mold from leaking between the mold and a PCB, and an EMI shielding structure and a method for manufacturing the EMI shielding structure using the same.

In accordance with an aspect of the present disclosure, an EMI shielding structure is provided. The EMI shielding structure includes a PCB on which a plurality of elements are mounted, an insulation molding member configured to cover the plurality of elements, a conductive shielding dam formed along a side surface of the insulation molding member, and a conductive shielding member formed on a top surface of the insulation molding member.

The shielding dam may have a longitudinal section formed in a shape of " ⌐ " to cover the side surface and the top surface of the insulation molding member.

A width to height ratio of the shielding dam may be greater than or equal to 1:3. In this case, a viscosity of a material forming the shielding dam may be greater than or equal to 20,000 cps.

A mounting gap between the elements may be less than or equal to 0.8 mm.

An inclination of an inner surface of the shielding dam may be the same as an inclination of the side surface of the insulation molding member. The inner surface of the shielding dam may be formed vertically or slantly.

The conductive shielding member may be a conductive shielding film which is attached to the top surface of the insulation molding member.

The conductive shielding member may be formed of a liquid conductive shielding material which is discharged by a nozzle and coated on the top surface of the insulation molding member.

The EMI shielding structure may further include an edge bridge which has electrical conductivity and covers a portion where the shielding dam and the conductive shielding member mutually contact each other.

The shielding dam may have a lower end electrically connected with a ground formed on the PCB.

In accordance with another aspect of the present disclosure, an EMI shielding structure is provided. The EMI shielding structure includes a PCB on which a plurality of elements are mounted, a mold which is seated on the PCB to enclose the plurality of elements, an insulation molding member which is molded after being injected into the mold and covers the plurality of elements, a conductive shielding dam which is formed along a side surface of the mold, and a conductive shielding member which covers a top surface of the mold and a top surface of the insulation molding member.

The shielding dam may have a longitudinal section formed in a shape of "⌐" to cover the side surface and the top surface of the mold.

A sealant may be disposed between the lower end of the mold and the top surface of the PCB.

In accordance with another aspect of the present disclosure, a method for manufacturing an EMI shielding structure is provided. The method includes providing a liquid sealant to a mold, setting the mold to bring the liquid sealant into contact with a surface of a PCB on which a circuit element is mounted, forming an insulation molding member for covering the circuit element by injecting an insulation material into the mold, removing the mold from the PCB, and forming a conductive shielding material for covering the insulation molding member.

In accordance with another aspect of the present disclosure, a method for manufacturing an EMI shielding structure is provided. The method includes setting a mold to be spaced from a PCB on which a circuit elements is mounted, injecting a liquid sealant between the mold and the PCB, forming an insulation molding member for covering the circuit element by injecting an insulation material into the mold, removing the mold from the PCB, and forming a conductive shielding material for covering the insulation molding member.

In accordance with another aspect of the present disclosure, a method for manufacturing an EMI shielding structure is provided. The method includes setting a mold having a lower end connected with a sealant on a PCB on which a circuit element is mounted, forming an insulation molding member for covering the circuit element by injecting an insulation material into the mold, and forming a conductive shielding material for covering both the mold and the insulation molding member.

In accordance with another aspect of the present disclosure, a nozzle for forming a shielding dam by discharging a conductive material is provided. The nozzle includes an outlet through which the conductive material is discharged, and a guide portion extending from one side of the outlet in a longitudinal direction of the nozzle.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which:

FIGS. 14A, 14B, 14C, 14D, and 14E are views illustrating a process of manufacturing an EMI shielding structure by evaporating a liquid sealant according to various embodiments of the present disclosure;

FIGS. 15A, 15B, 15C, 15D, and 15E are views illustrating a process of manufacturing an EMI shielding structure of removing a liquid sealant by post-processing according to various embodiments of the present disclosure;

FIGS. 18A, 18B, and 18C are views illustrating a process of manufacturing an EMI shielding structure by controlling a height of an insulation molding member differently by controlling an amount of insulation material to be injected into a mold when a plurality of shielding structures are formed according to various embodiments of the present disclosure;

FIGS. 19A, 19B, 19C, 19D, 19E, 20A, 20B, 20C, 20D, and 20E are views illustrating a process of manufacturing an EMI shielding structure by including a mold in the shielding structure without removing the mold according to various embodiments of the present disclosure;

Throughout the drawings, it should be noted that like reference numbers are used to depict the same or similar elements, features, and structures.

DETAILED DESCRIPTION

Figure 1A:
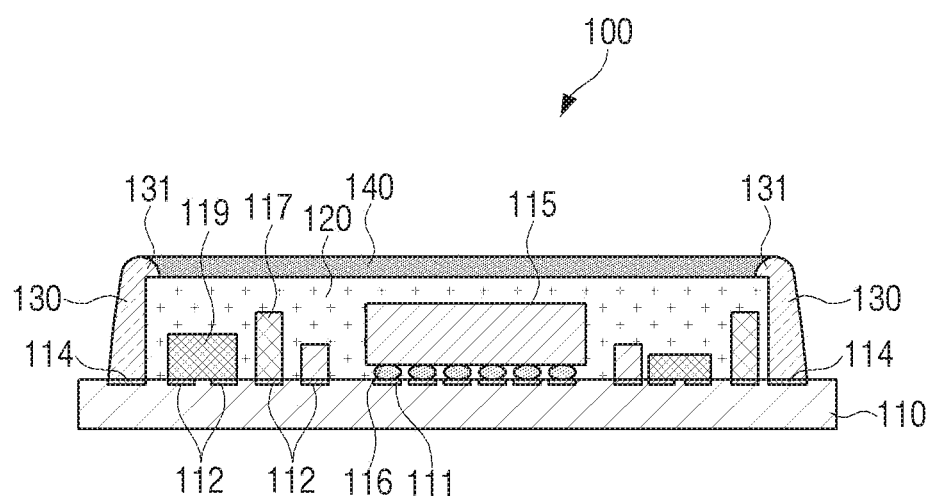
FIG. 1A is a cross section view illustrating an electromagnetic interference (EMI) shielding structure according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

It will be understood that when an element is referred to as being "on" or "in contact with" another element, the element can directly contact or be connected with another element, and there is an intervening element therebetween. In addition, it will be understood that when an element is referred to as being "directly on" or "in direct contact with" another element, there is no intervening element therebetween. Other expressions explaining relationships between the elements, for example, "between", "directly between," or the like, will be understood likewise.

The terms such as "first" and "second" used in various embodiments may be used to explain various elements, and the elements should not be limited by these terms. These terms may be used for the purpose of distinguishing one element from another element. For example, a first element may be named a second element without departing from the scope of right of various embodiments of the present disclosure, and similarly, a second element may be named a first element.

The terms "include" or "have" indicate the presence of features, numbers, operations, elements, and components described in the specification, or a combination thereof, and do not preclude the addition of one or more other features, numbers, operation, elements, or components, or a combination thereof.

The terms used in describing the various embodiments will be interpreted as having meanings well known to a person skilled in the art unless otherwise defined.

An electromagnetic interference (EMI) shielding structure according to various embodiments may be applied to a smart phone, a display device, a wearable device, and the like.

The EMI shielding structure according to various embodiments forms an insulation molding member using a mold, and forms a shielding dam by moving a nozzle along the side portion of the insulation molding member. Since the shielding dam is formed leaning on the side portion of the insulation molding member, the shielding dam may be formed with a high width to height ratio. When the shielding dam is formed along the side portion of the insulation molding member as described above, a portion of the nozzle through which a material is discharged can have a narrow width, such that the EMI shielding structure can be applied to a highly integrated mounting substrate in which circuit elements have a very narrow gap therebetween.

In addition, the EMI shielding structure according to various embodiments may apply a liquid sealant in order to prevent an insulation material injected into the mold from leaking via a gap formed between the mold and the printed circuit board (PCB). The liquid sealant may be evaporated at a temperature higher than a curing temperature of the insulation molding member according to the material, and may be removed from the PCB. When the liquid sealant is formed of a material which is not evaporated, the liquid sealant may be removed from the PCB through post-processing after the insulation molding member is cured.

In addition, the EMI shielding structure according to various embodiments shields a plurality of circuit elements. However, this should not be considered as limiting and the EMI shielding structure may be formed to shield only a single circuit element.

Hereinafter, the structure of the above-described nozzle and the process of forming the shielding dam using the nozzle, and an example of using the liquid sealant when forming the insulation molding member will be described in detail with reference to the accompanying drawings.

FIG. 1A is a cross section view illustrating an EMI shielding structure according to an embodiment of the present disclosure.

Referring to FIG. 1A, an EMI shielding structure 100 may include a PCB 110 and a plurality of circuit elements 115, 117, and 119 which are mounted on the PCB 110. The plurality of circuit elements, which are heterogenous circuit elements, may include integrated circuit (IC) chips, passive elements, and heterogenous components. For example, the IC chip may be an application processor (AP), a memory, a radio frequency (RF) chip, and the like, the passive element may be a resistor, a capacitor, a coil, and the like, and the heterogenous component may be a connector, a card socket, an EMI shielding component, and the like.

A first connection pad 111 and a second connection pad 112 may be patterned on the top surface of the PCB 110 to be electrically connected with the plurality of circuit elements 115, 117, and 119. A plurality of first connection pads 111 and a plurality of second connection pads 112 may be formed. The first and second connection pads 111 and 112 may be formed to ground the plurality of circuit elements 115, 117, and 119 or transmit signals.

A ground pad 114 may be patterned on the PCB 110. The ground pad 114 may be formed inside the PCB 110 with the top surface thereof being exposed so as to prevent the top surface of the PCB 110 from being exposed. In this case, the ground pad 114 may be integrally formed with a ground layer (not shown) formed inside the PCB 110.

The ground pad 114 may be formed to ground the plurality of circuit elements 115, 117, and 119 or transmit signals. A shielding dam 130, which will be described below, may be grounded along a forming path of the shielding dam 130 or by electrically connecting with the ground pad 114 formed on a part of the forming path, when the shielding dam 130 is formed on the PCB 110.

The circuit element 115 may include a plurality of connection terminals 116 which are electrically connected with the first connection pads 111 of the PCB 110. The plurality of connection terminals 116 may be formed in a ball grid array (BGA) method like a solder ball. However, the connection terminals 116 are not limited to the BGA method and may be formed in various methods, for example, quad flat no lead (QFN), plastic leaded chip carrier (PLCC), quad flat package (QFP), small out line package (SOP), thin/shrink/ thin shrink SOP (TSOP/SSOP/TSSOP), according to a lead shape of the element 115.

The other circuit elements 117 and 119 may include at least one connection terminal (not shown) which is electrically connected with the second connection pad 112 of the PCB 110. The plurality of circuit elements 117 and 119 may be lower than or higher than the circuit element 115 described above when being mounted on the PCB 110. Each of the circuit elements 115, 117, and 119 may be spaced from the shielding dam 130 by a predetermined distance so as not to be brought into contact with the shielding dam 130.

The EMI shielding structure 100 according to an embodiment may include an insulation molding member 120 for covering the plurality of circuit elements 115, 117, and 119, the shielding dam 130 formed along the side portion of the insulation molding member 120, and a shielding member 140 formed on the top surface of the insulation molding member 120.

The insulation molding member 120 may insulate between the circuit elements 115, 117, and 119, between each circuit element 115, 117, 119 and the shielding dam 130, and between each circuit element and the shielding member 140.

The insulation molding member 120 may be formed by injecting an insulation material into a mold 10 and curing the insulation material. In this case, the insulation material may be in close contact with the outer surfaces of the circuit elements 115, 117, and 119, and may be formed of a material having fluidity so as to flow into a gap formed between each of the circuit elements 115, 117, 119 and the PCB. The insulation molding member 120 may be cured through various curing processes such as room temperature vulcanization, thermal curing, UV curing, or the like.

The insulation material may be a thixotropy material or a phase change material (a thermoplastic material or a thermosetting material) having fluidity.

The thixotropy material may include at least one of synthetic micronised silica, bentonite, particle-surface treated calcium carbonate, hydrogen-added castor oil, metal soap, aluminum stearate, polyamide wax, polyethylene oxide, and linseed polymerized oil. For example, the metal soap may include aluminum stearate.

The phase change material may include at least one of polyurethane, polyurea, polyvinyl chloride, polystyrene, acrylonitrile butadiene styrene (ABS), polyamide, acrylic, epoxy, silicone, and polybutylene terephthalate (PBTP).

The shielding dam 130 may be formed along the side portion of the insulation molding member 120 which is cured. In this case, the shielding dam 130 may be formed leaning on the side portion of the insulation molding member 120, and may cover the side surface of the insulation molding member 120 and a part of the top surface of the insulation molding member 120. When the shielding dam 130 is formed leaning on a predetermined structure like the insulation molding member 120 as described above, the shielding dam 130 may have a higher width to height ratio than when the shielding dam 130 is formed to form a shape by itself without leaning on a separate structure, that is, in a free standing type. Herein, the width to height ratio of the shielding dam is a value which is obtained by dividing the height of the shielding dam 130 by the width of the shielding dam. When the shielding dam 130 formed leaning on the side surface of the insulation molding member 120 as described above has a viscosity greater than or equal to about 20,000 cps, the shielding dam 130 may be formed to have a width to height ratio higher than or equal to 1:3. On the other hand, when the shielding dam 130 formed in the free standing type has a viscosity greater than or equal to about 80,000 cps, the shielding dam 130 may be formed to have a width to height ratio higher than or equal to 1:2. Accordingly, when the shielding dam 130 is formed leaning on the side surface of the insulation molding member 120 as in the above-described embodiment and has a lower viscosity, the shielding dam 130 may have a higher width to height ratio than when the shielding dam 130 is formed in the free standing type.

The shielding dam 130 may be formed of a conductive material having an EMI shielding characteristic which can prevent an EMI. Accordingly, the shielding dam 130 can prevent the EMI in advance, which may influence other electronic components in an electronic device including the EMI shielding structure 100, by blocking electromagnetic waves generated in the plurality of circuit elements 115, 117, and 119. Interference such as an electromagnetic wave noise or malfunction can be ultimately blocked in the electronic device including the EMI shielding structure 100, such that the reliability of a product can be prevented from being reduced. As described above, the shielding dam 130 may prevent electromagnetic waves which are unavoidably generated during the operating process of the circuit elements 115, 117, and 119 from influencing the outside.

The conductive material may have a high viscosity (greater than or equal to 100,000 cps), such that the shielding dam 130 is formed to have a high width to height ratio and maintains a shape at the time of being discharged without flowing down. When the material has a high viscosity as described above, the width to height ratio of the shielding dam 130 can be increased and thus the height of the shielding dam can be increased.

In addition, in the case of a double-sided PCB, the shielding dam may be formed on the front surface and then the PCB may be turned over to have the shielding dam formed on the rear surface thereof. In this case, when a conductive material having a high viscosity is used, the shielding dam formed on the front surface may not flow down and maintain its shape as it is. Accordingly, there is an advantage that the entire work process can be proceeded rapidly.

Specifically, the conductive material for forming the shielding dam 130 may be an electroconductive material having electrical conductivity greater than or equal to 1.0E+04 S/m. Such an electroconductive material may include an electroconductive filler and a binder resin.

The electroconductive filler may use metal such as Ag, Cu, Ni, Al, Sn, or the like, use conductive carbon such as carbon black, carbon nanotube (CNT), graphite, or the like, use metal coated materials such as Ag/Cu, Ag/Glass fiber, Ni/Graphite, or the like, or use a conducting polymer material such as polypyrrole, polyaniline, or the like. In addition, the electroconductive filler may be formed in any one or a combination of a flake type, a sphere type, a rod type, and a dendrite type.

The binder resin may use a silicon resin, an epoxy resin, a urethane resin, an alkyd resin, or the like. The material for forming the shielding dam 130 may additionally contain an additive (a viscosity agent, an antioxidant, a polymer surfactant, or the like) and a solvent (water, alcohol, or the like) to enhance other functions.

Figure 1B:
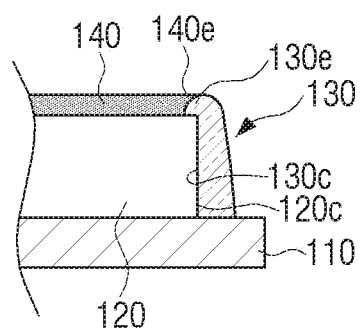
FIGS. 1B and 1C are views illustrating a structure in which an inner surface of a shielding dam is formed vertically or slantingly according to various embodiments of the present disclosure.
Figure 1C:
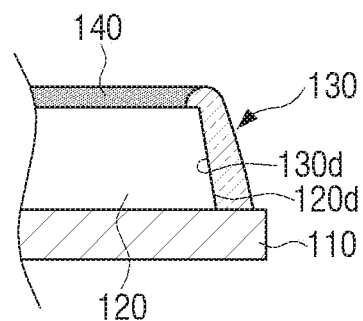

FIGS. 1B and 1C are views illustrating a structure in which an inner surface of a shielding dam is formed vertically or slantingly according to various embodiments of the present disclosure.

Referring to FIGS. 1A to 1C, the shielding dam 130 may be formed leaning on the side portion of the insulation molding member 120, and cover the side surface of the insulation molding member 120 and a part of the top surface of the insulation molding member 120. Accordingly, the longitudinal section of the shielding dam 130 is formed in the shape of " ⊓ " as illustrated in FIG. 1B. In this case, an inner surface 130c of the shielding dam 130 may have the same inclination as that of a side surface 120c of the insulation molding member 120. When the side surface 120c of the insulation molding member 120 is perpendicular to the top surface of the PCB 110 as illustrated in FIG. 1B, the inner surface 130c of the shielding dam 130 may be perpendicular. In addition, when the insulation molding member 120 is formed to have the lower portion longer than the upper portion as illustrated in FIG. 1C and thus a side surface 120d of the insulation molding member 120 is inclined, an inner surface 130d of the shielding dam 130 may have the same inclination as that of the side surface 120d of the insulation molding member 120. On the other hand, when the shielding dam is formed in the free standing type (the shielding dam is formed to have a predetermined width to height ratio without leaning on a separate structure), the width of the lower side of the shielding dam may be larger than the width of the upper side. Accordingly, the inner surface of the shielding dam formed in the free standing type has an inclination in a direction opposite to the inclination direction of the inner surface 130d of the shielding dam 130 of the embodiment.

Referring to FIG. 1B, an upper end 130e of the shielding dam 130 formed on the upper side of the insulation molding member 120 is brought into contact with an edge 140e of the shielding member 140, such that the shielding dam 130 can completely cover the outer surface of the insulation molding member 120. In this case, a part of the upper end 130e of the shielding dam 130 may be covered by the edge 140e of the shielding member 140.

The shielding member 140 may be formed of a conductive material having fluidity like the shielding dam 130, and may be formed of the same material as the above-described material of the shielding dam 130.

The shielding member 140 may be formed on the top surface of the insulation molding member 120. When the shielding dam 130 is formed along the side portion of the insulation molding member 120, an upper end 131 of the shielding dam 130 protrudes to be higher than the top surface of the insulation molding member 120. Accordingly, a space for filling with the shielding member 140 may be provided on the top surface of the insulation molding member 120.

When the top surface of the insulation molding member 120 is filled with the shielding member 140, the shielding member 140 may be brought into contact with the upper end 131 of the shielding dam 130 and electrically connected therewith. Accordingly, the shielding dam 130 and the shielding member 140 completely encloses the outer side of the insulation molding member 120, such that an optimal shielding structure can be achieved.

Hereinafter, a manufacturing process of the EMI shielding structure 100 according to an embodiment will be described in sequence with reference to FIGS. 2A to 2F.

FIGS. 2A to 2F are views illustrating a manufacturing process of an EMI shielding structure in sequence according to various embodiments of the present disclosure.

Figure 3:
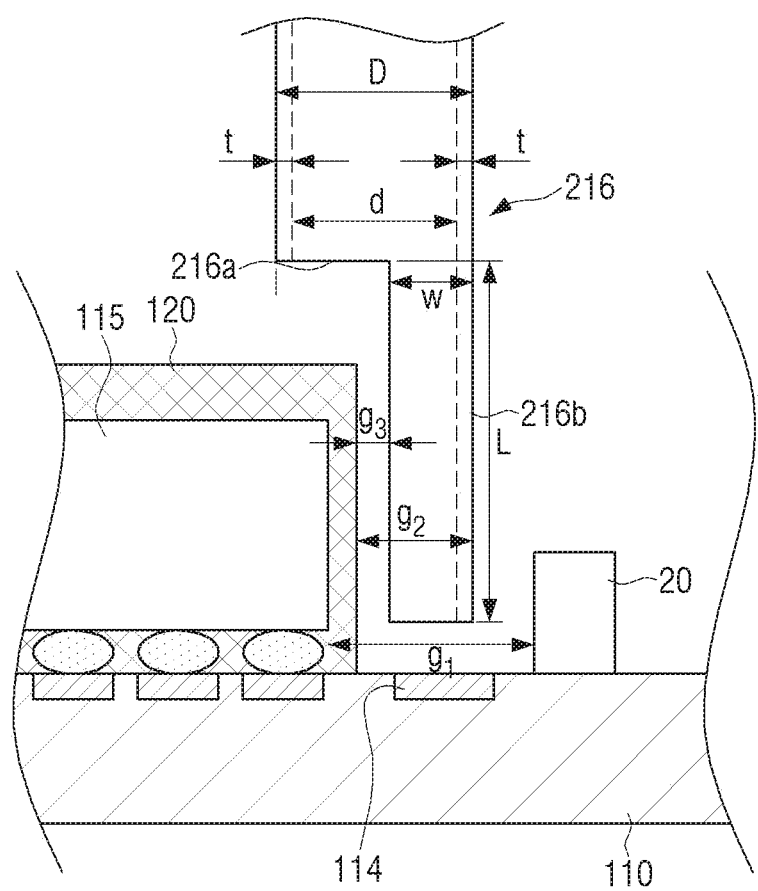
FIG. 3 is a view illustrating an example of a process of forming a shielding dam on a side portion of an insulation molding member using a nozzle on a printed circuit board (PCB), in which circuit elements are high-density mounted according to an embodiment of the present disclosure.

FIG. 3 is a view illustrating an example of a process of forming a shielding dam on a side portion of an insulation molding member using a nozzle on a PCB, in which circuit elements are high-density mounted according to an embodiment of the present disclosure.

Figure 2A:
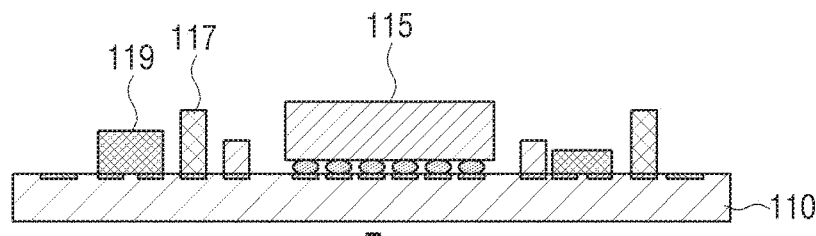
FIGS. 2A, 2B, 2C, 2D, 2E, and 2F are views illustrating a process of manufacturing an EMI shielding structure illustrated in FIGS. 1A to 1C according to various embodiments of the present disclosure.
Figure 2B:
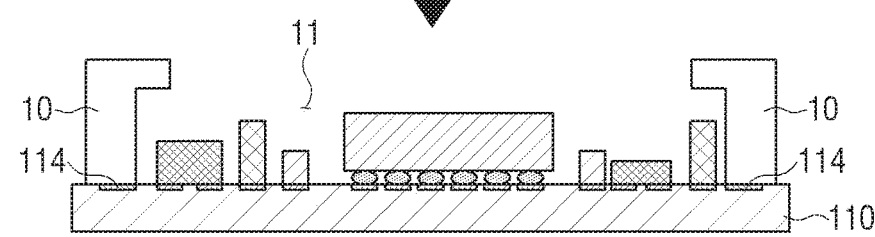

Referring to FIGS. 2A and 2B, when the PCB 110 on which the plurality of circuit elements 115, 117, and 119 are mounted is loaded into a work position as illustrated in FIG. 2A, a mold 10 is arranged on a position of the PCB 110 where the insulation molding member 120 is to be formed as illustrated in FIG. 2B.

Figure 2C:
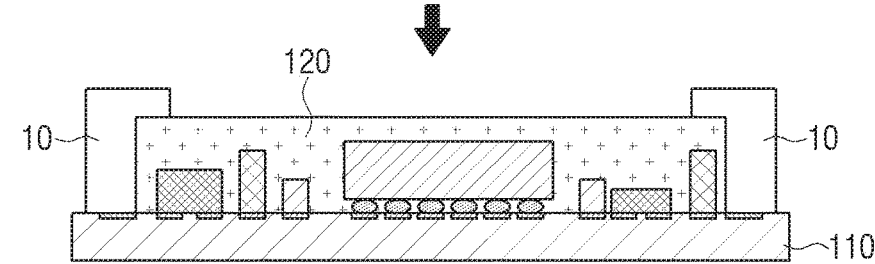

Referring to FIG. 2C, an insulation material having fluidity is injected into an inside 11 of the mold 10, and then the PCB 110 is put into an oven (not shown) and heated at a predetermined temperature during a predetermined time in order to cure the insulation material. The insulation material cured in the inside 11 of the mold 10 becomes the insulation molding member 120.

Figure 2D:
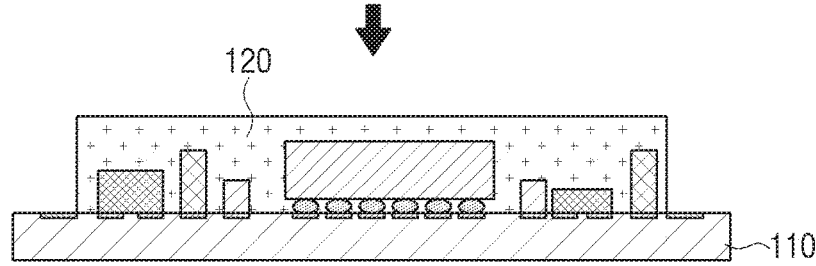

Referring to FIG. 2D, in response to the insulation molding member 120 being formed, the PCB 110 is drawn out from the oven and then the mold 10 is removed from the PCB 110.

Figure 2E:
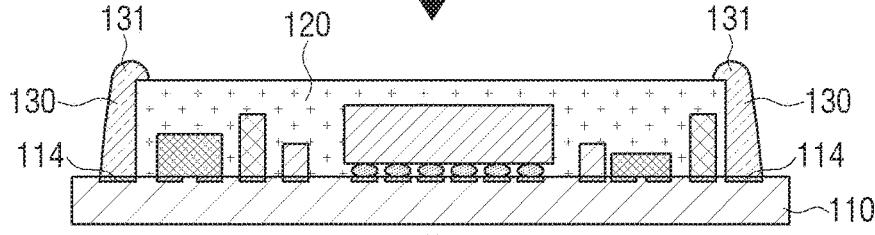
Figure 2F:
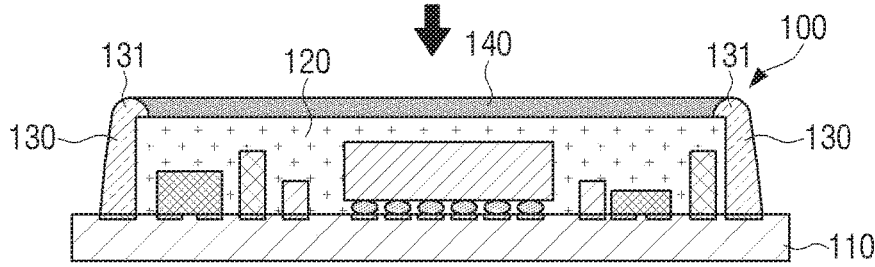

Referring to FIGS. 2E and 2F, the shielding dam 130 for covering the side surface of the insulation molding member 120 and a part (edge) of the top surface of the insulation molding member 120 is formed by continuously discharging a predetermined amount of conductive material along the side portion of the insulation molding member 120 as illustrated in FIG. 2E. The insulation molding member 120 has the shielding member 140 formed on the upper surface of the insulation molding member 120 as illustrated in FIG. 2F. The conductive material is discharged from a nozzle 216 (see FIG. 3) which moves along the side portion of the insulation molding member 120.

Referring to FIG. 3, the nozzle 216 has an outlet 216a formed at the lower end thereof, and a guide portion 216b extends from one side of the outlet 216a to a predetermined length in a longitudinal direction of the nozzle 216. In this case, the nozzle 216 may be disposed such that the outlet 216a is higher than the top surface of the insulation molding member 120 and the guide portion 216b passes between the side surface of the insulation molding member 120 and a predetermined circuit element 20. The guide portion 216b guides the material discharged from the outlet 216a to move toward the side surface of the insulation molding member 120.

The shape of the portion of the nozzle 216 through which the material is discharged is formed taking into consideration that the nozzle 216 should be moved smoothly on the highly integrated mounting PCB. That is, in the case of the highly integrated mounting PCB, a gap (g1) between the circuit element 115 and the circuit element 20 is designed to be very narrow, less than or equal to 0.8 mm. When it is assumed that the gap (g1) between the elements is 0.8 mm, an outer diameter (D) of the nozzle 216 may be set to 0.9 mm, a thickness (t) may be set to 0.1 mm, and an inner diameter (d) may be set to 0.8 mm. Herein, the inner diameter (d) of the nozzle 216 may be the same as the diameter of the outlet 216a. The guide portion 216b downwardly extending from the outlet 216a may have a predetermined length (L) and a predetermined width (w). In this case, the width (w) of the guide portion 216b will be enough as long as a gap between one side of the guide portion 216a and the side surface of the insulation molding member 120 is maintained and a gap between the other side of the guide portion 216b and the circuit element 20 is maintained when the guide portion 216b is disposed between the side surface of the insulation molding member 120 and the circuit member 20. For example, when a distance (g2) from the other side of the guide portion 216b to the side surface of the insulation molding member 120 is 0.5 mm, a gap (g3) between one side of the guide portion 216b and the side surface of the insulation molding member 120 may be maintained as 0.1 mm.

A part of the material discharged through the outlet 216a is discharged in contact with the guide portion 216b. In this case, the part of the material contacting the guide portion 216b may generate a frictional resistance between the material and the guide portion 216b while contacting the inner surface of the guide portion 216b, and the other part of the material that does not contact the guide portion 216b does not generate a frictional resistance by the guide portion 216b or is hardly influenced by the frictional resistance and thus the material is discharged rather rapidly.

As described above, a phenomenon in which there is a difference in the discharging speed when the material discharged through the outlet 216a escapes from the outlet 216a arises. The length (L) of the guide portion 216b may be set in consideration of such a phenomenon. For example, the nozzle 216 may continuously discharge the material through the outlet 216a while moving along the side portion of the insulation molding member 120 at constant speed. In this case, when the length of the guide portion 216b is too long, a part of the material adjacent to the guide portion 216b out of the material discharged from the outlet 216a moves toward the insulation molding member 120 before it is guided to the lower end of the guide portion 216b. To this end, the shielding dam 130 may have a thin lower portion in comparison to the upper portion or may not cover the lower portion of the side surface of the insulation molding member 120. In addition, when the length of the guide portion 216b is too short, the lower portion of the shielding dam 130 may be thicker than the upper portion or the shielding dam 130 may not cover the upper portion of the side surface of the insulation molding member 120. Accordingly, since the length (L) of the guide portion 216b may influence the forming of the shielding dam 130, the length (L) of the guide portion 216b may be formed appropriately in consideration of the height of the insulation molding member 120.

In addition, the inner surface of the guide portion 216b may be formed to face the insulation molding member 120 in order to move the material discharged through the outlet 216a toward the insulation molding member 120 when the nozzle 216 moves along the insulation molding member 120 to form the shielding dam 130.

Figure 4:
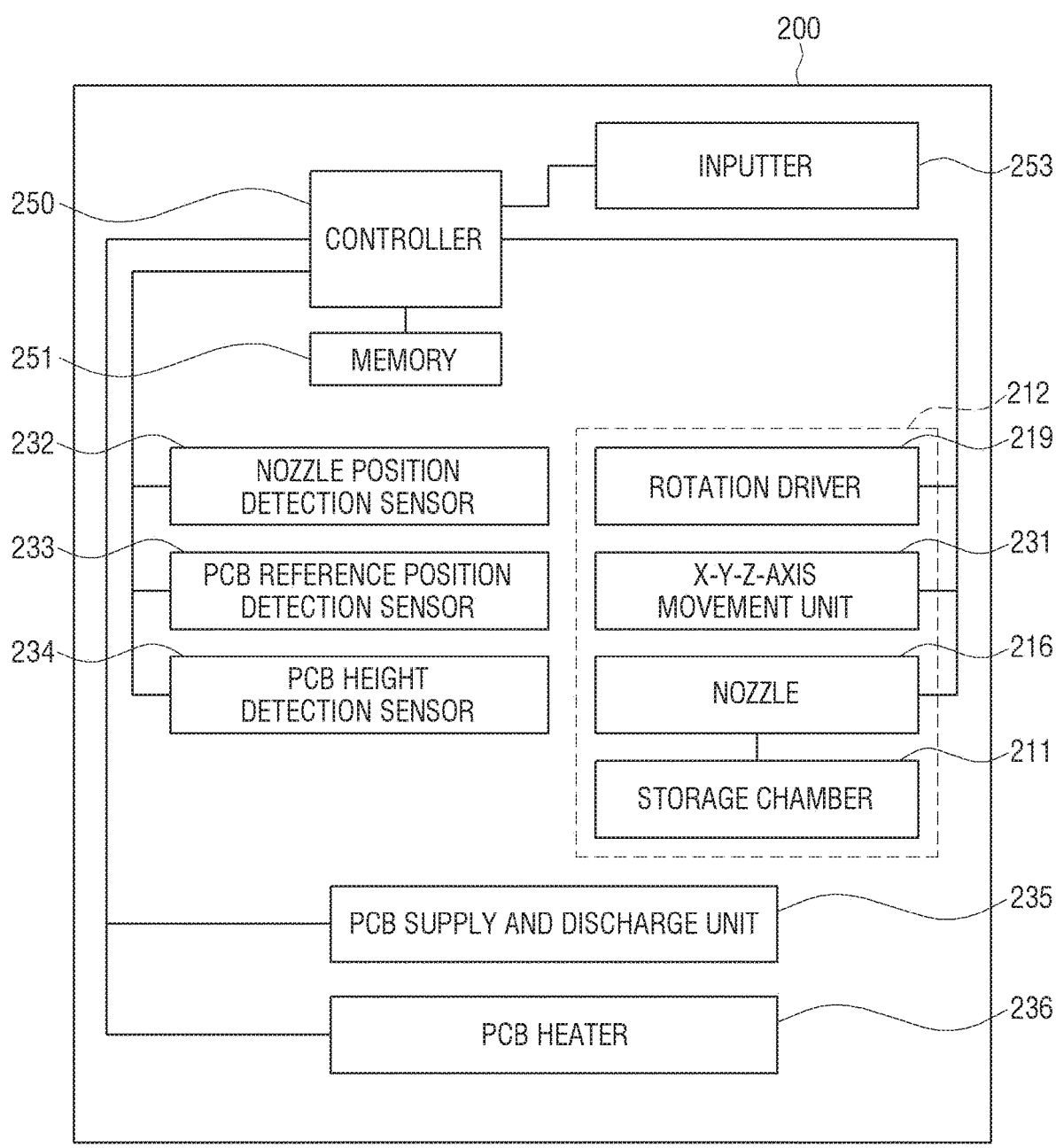
FIG. 4 is a block diagram illustrating a material discharge device for forming a shielding structure according to an embodiment of the present disclosure.

FIG. 4 is a block diagram illustrating a material discharge device for forming a shielding structure according to an embodiment of the present disclosure.

The material discharge device for forming the EMI shielding structure according to an embodiment may be a 3D printer.

Referring to FIG. 4, a material discharge device 200 may include one nozzle 216 by way of an example. However, this should not be considered as limiting and the material discharge device 200 may include a plurality of nozzles. In particular, the material discharge device 200 may include a plurality of nozzles having guide portions 216b of different lengths in order to form shielding dams 130 having different heights on the side portion of the insulation molding member 120.

The material discharge device 200 may include a dispenser 212 to discharge a predetermined amount of material. The dispenser 212 may include a storage chamber 211 for storing the material, and the nozzle 216 for discharging the material supplied from the storage chamber 211.

In addition, the dispenser 212 may include an X-Y-Z-axis movement unit 231 for moving the nozzle 216 in the X-axis, Y-axis, and Z-axis directions, and a rotation driver 219 for rotating the nozzle 216 in a clockwise direction or in a counter clockwise direction or stopping rotating. The X-Y-Z-axis movement unit 231 may include a plurality of motors (not shown) for moving the nozzle 216 in the X-axis, Y-axis and Z-axis directions, and may be connected to a nozzle mounting unit (not shown) in which the nozzle 216 is mounted in order to forward the driving force of the step motors to the nozzle 216. The rotation driver 219 may include a motor (not shown) for providing rotating power and an encoder (not shown) for controlling the rotation angle of the nozzle 216 by sensing the number of rotation of the motor. The X-Y-Z-axis movement unit 231 and the rotation driver 219 may be electrically connected to a controller 250 and may be controlled by the controller 250.

In the material discharge device 200, the end of the nozzle through which the material is discharged may not exactly coincide with a pre-set setting position when the outlet of the nozzle 216 is cleaned or the nozzle 216 is replaced with new one. Accordingly, a nozzle position detection sensor 232 is provided to set the nozzle 216 in the setting position.

The nozzle position detection sensor 232 may use a vision camera and may be spaced from the lower side of the nozzle 216 by a predetermined distance. The position of the end of the nozzle may be read through an image captured by the nozzle position detection sensor 232 with reference to the calibration of the nozzle, and may be compared with an origin point value of the nozzle pre-stored in a memory 251, and the nozzle 216 may be moved as much as difference values on the X and Y axes, such that the end of the nozzle is made to coincide with the origin point of the nozzle. In this case, the nozzle 216 may be moved by moving the nozzle mounting unit by driving the X-Y-Z-axis movement unit 231.

When the PCB is loaded into a location for forming the shielding dam, the material discharge device 200 may detect the posture of the PCB in the X-Y plane state in which the PCB is laid, and may set a starting point (Ap) of the nozzle 216 for discharging the material. The material discharge device 200 may include a PCB reference position detection sensor 233 and a PCB height detection sensor 234 in order to detect the posture of the PCB after loading the PCB.

The PCB reference position detection sensor 233 is a sensor for determining a PCB loading home position, and may use a vision camera. The PCB reference position detection sensor 233 may detect whether the PCB loaded into a work space to form the shielding structure is in a pre-set position or how much the PCB deviates from the pre-set position. For example, when the PCB is loaded into the work position, the controller 250 may move the PCB reference position detection sensor 233 to coordinates of a pre-set first reference mark, capture the first reference mark of the PCB, and then compare the currently captured first reference mark and the pre-set first reference mark, and the PCB reference location detection sensor 233 may determine whether the PCB is in the home position or not.

In response to the PCB reference position detection sensor 233 determining that the PCB is in the home position, the controller 250 may calculate a location difference between the coordinates of the current first reference mark and the coordinates of the pre-set first reference mark. The controller 250 may calculate a location difference between the coordinates of a current second reference mark and the coordinates of a pre-set second reference mark in the same method as the method of calculating the coordinates of the first reference mark.

The material discharge device 200 may include a PCB supply and discharge unit 235 for loading the PCB into a work position to form the shielding dam on the PCB, and unloading the PCB after forming the shielding dam.

The material discharge device 200 may include a PCB heater 236 to heat the PCB to a predetermined temperature in order to reduce time required to dry the formed shielding dam 130.

The material discharge device 200 may include the inputter 253 through which a user directly inputs the moving path of the nozzle 216.

The inputter 253 may be implemented by using a touch screen through which a touch input is possible, or a typical key pad. The user may input the path of the nozzle through the inputter 253. For example, the user may input the path of the nozzle one time, and the path data of the nozzle inputted in this way may be stored in the memory 251. The path data of the nozzle may be modified afterward.

A process of inputting the path of the nozzle through the inputter 253 as described above will be described below.

First, at least two reference marks displayed on the PCB loaded into the work position are captured using the PCB reference position detection sensor 233 (for example, may be a vision camera and referred to as a vision camera hereinafter), a distance between the two reference marks is measured, and then a distance value between the two reference marks is stored in the memory 251 with images of the references. When the PCB has a rectangular shape, the two reference marks may be displayed at the upper end of the left side of the PCB and the lower end of the right side of the PCB. In this case, the distance between the two reference marks may substantially indicate the length of a diagonal line of the PCB.

Specifically, in response to the PCB being loaded into the work position, the user may move the vision camera to the position of the first reference mark (for example, with reference to the center of the first reference mark or a part of the first reference mark) displayed at the upper end of the left side through forward, backward, left, and right buttons of the inputter 253, and then, in response to a save button of the inputter 253 being pressed, the controller 250 may acquire coordinates (X1, Y1, Z1) of the first reference mark by calculating a distance of the first reference mark from a pre-set origin point (0,0,0), and store the coordinates in the memory 251. A capturing location of the vision camera which moves with the nozzle may be offset from the center of the nozzle by a predetermined distance. Accordingly, the coordinates (X1, Y1, Z1) of the first reference mark may be calculated by the controller 250 in consideration of the offset value. In addition, in response to the user pressing a capture button, an image of the first reference mark is stored in the memory 251.

The user may move the vision camera to the position of the second reference mark (for example, with reference to the center of the second reference mark or a part of the second reference mark) displayed at the lower end of the right side through the forward, backward, left, and right buttons of the inputter 253, and then, in response to the save button of the inputter 253 being pressed, the controller 250 may acquire coordinates (X2, Y2, Z2) of the second reference mark by calculating a distance of the second reference mark from the pre-set origin point (0,0,0), and store the coordinates in the memory 251. In addition, in response to the user pressing the capture button, an image of the second reference mark is stored in the memory 251. The coordinates (X2, Y2, Z2) of the second reference mark may be calculated by the controller 250 in consideration of the offset value in the same way as in the process of calculating the coordinates (X1, Y1, Z1) of the first reference mark described above.

The controller 250 may calculate a distance between the two positions using the positions of the first and second reference marks detected as described above, and store the distance in the memory 251.

The user may move the vision camera along the path of the shielding dam to be formed on the PCB using the forward, backward, left, and right buttons of the inputter 253, and may input a plurality of coordinates located on the moving path of the nozzle while checking real-time images captured by the vision camera with naked eyes. Corresponding coordinates may be inputted by pressing a coordinates' input button of the inputter 253 when the vision camera is located at a certain point on the moving path of the nozzle. The coordinates inputted in this way are stored in the memory 251.

As will be described below, the plurality of coordinates may include coordinates of a point (Ap, see FIG. 5) at which the nozzle starts discharging the material, coordinates of a point at which the nozzle finishes discharging (almost adjacent to the starting point (Ap) when the shielding dam is formed, drawing a closed curve line), and coordinates of points (Bp, Cp, Dp, Ep, and Fp, see FIG. 5) at which the nozzle should change the direction while moving.

In addition, in order to program the moving path of the nozzle, the inputter 253 may include various command buttons, such as a move button to move the nozzle to designated coordinates, a line button to instruct the nozzle to move while discharging the material, and a rotate button to change the moving direction of the nozzle. The user may generate the moving path of the nozzle by matching the command buttons and the coordinates and rotation angles.

In response to the moving path of the nozzle being programmed by the user as described above, the controller 250 may automatically form the shielding dam by discharging the material while moving the nozzle along the moving path.

The nozzle path data inputted through the inputter 253 as described above may be stored in the memory 251. The controller 250 may move the nozzle along the previously inputted path by driving the X-Y-Z-axis movement unit 231 and the rotation driver 219 according to the nozzle path data stored in the memory 251. The nozzle path data may include a distance by which the nozzle 216 is moved straightly along the top surface of the PCB 110, and a rotation direction and an angle of the nozzle 216.

In the present embodiment, the user directly inputs the moving path of the nozzle through the inputter 253. However, this should not be considered as limiting, and the nozzle moving path may be pre-stored in the memory 251. In this case, a plurality of nozzle moving paths corresponding to patterns of the shielding dam formed variously according to products may be pre-stored to correspond to the patterns. In addition, calibration information, reference position information of the nozzle, PCB reference position information, PCB reference height information may be pre-stored in the memory 251 through the inputter 253 in addition to the moving path of the nozzle.

Figure 5:
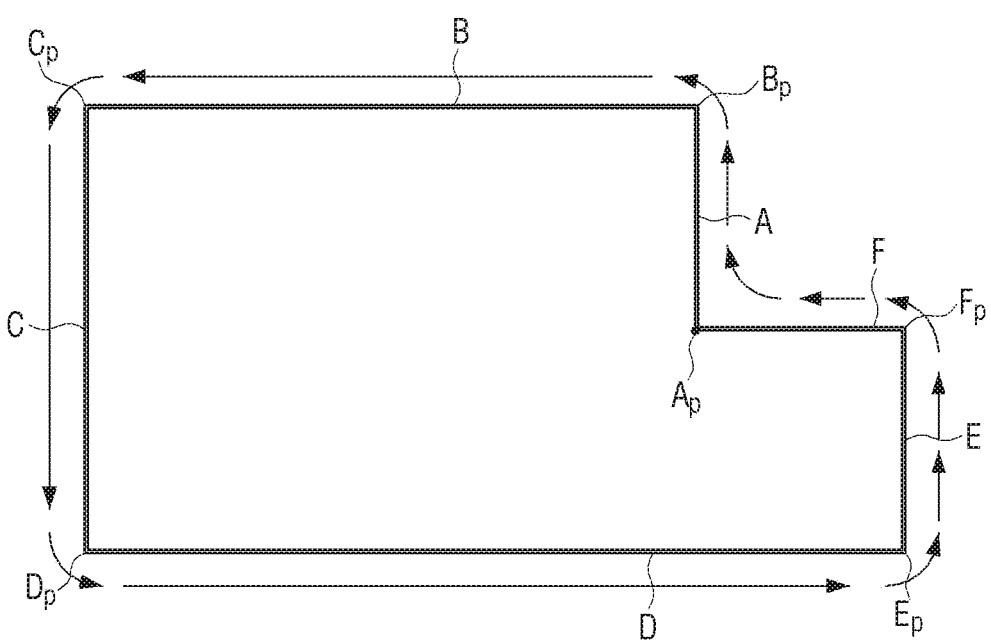
FIG. 5 is a view illustrating a moving path of a nozzle which is inputted through an inputter provided in a material discharge device according to an embodiment of the present disclosure.

FIG. 5 is a view illustrating a moving path of the nozzle which is inputted through an inputter provided in a material discharge device according to an embodiment of the present disclosure.

Referring to FIG. 5, the nozzle 216 may be moved along the path for forming the shielding dam based on the nozzle path data.

The nozzle 216 is set at coordinates corresponding to the starting point (Ap). In this case, the controller 250 may determine a direction in which the molding member 120 is disposed, and rotate the nozzle 216 by a predetermined angle by driving the rotation driver 219 such that the inner surface of the guide portion 216 faces the side surface of the insulation molding member 120.

The nozzle 216 set at the coordinates corresponding to the starting point (Ap) is linearly moved by the X-Y-Z-axis movement unit 231 as much as a section A in the +Y axis direction. Next, the nozzle 216 moves along a section where the path curves (a section including a point (Bp) connecting the section A and a section B). In this case, at the same time of being moved along the nozzle path by the X-Y-Z-axis movement unit 231, the nozzle 261 may be rotated by the rotation driver 219 such that the inner surface of the guide portion 216b keeps facing the insulation molding member 120.

In response to the nozzle 216 passing the section where the path curves, the nozzle 216 is linearly moved by the X-Y-Z-axis movement unit 23 as much as the section B in the -X-axis direction. In this way, the nozzle 216 may be linearly moved and rotated by the rotation driver 219 and the X-Y-Z-axis movement unit 231 through the other sections B, C, D, E, and F, and then return to the starting point (Ap). Then, the nozzle 216 finishes moving along the path.

Figure 6:
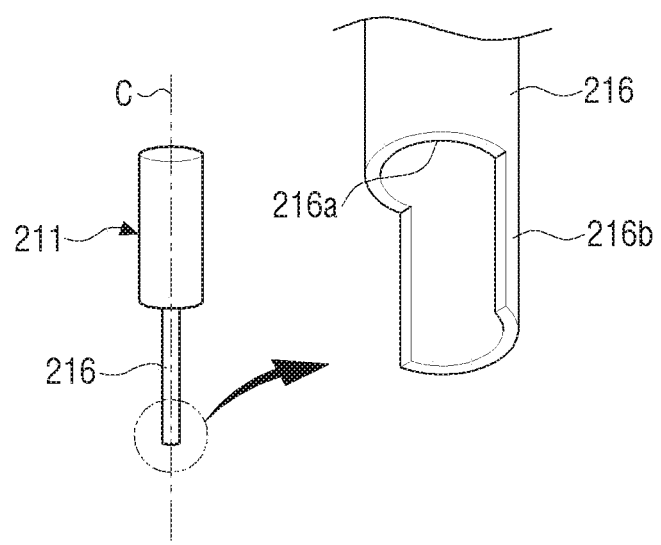
FIG. 6 is a view illustrating a nozzle of a material discharge device according to an embodiment of the present disclosure.

FIG. 6 is a view illustrating an outlet through which a material for forming a shielding dam is discharged from a nozzle of a material discharge device according to an embodiment of the present disclosure.

Referring to FIG. 6, the nozzle 216 discharges the material through the outlet 216a while being moved by the X-Y-Z-axis movement unit 231 and being rotated by the rotation driver 219.

The outlet 216a may be formed toward the lower side of the nozzle 216 and the guide portion 216b may downwardly extend from the lower end of the outlet 216a in the longitudinal direction of the nozzle 216.

In response to the nozzle 216 being set at a position for discharging the material in order to form the shielding dam 130 along the side portion of the insulation molding member 120 as illustrated in FIG. 3, the outlet 216a may have a part thereof located over the top surface of the insulation molding member 120 such that the material covers a part (edge) of the top surface of the insulation molding member 120. The guide portion 216b is disposed between the insulation molding member 120 and the circuit element 20 and is disposed so as not to interfere with the insulation molding member 120 and the circuit element 20 when the nozzle 216 moves.

The guide portion 216b guides the material discharged through the outlet 216a to move toward the lower side of the insulation molding member 120, and simultaneously, guides the material to move toward the insulation molding member 120 by preventing the material from spreading in a direction going away from the insulation molding member 120.

The nozzle 216 forms the shielding dam 130 on the side surface and the top surface of the insulation molding member 120 while moving along the path which is pre-set to form the shielding dam 130, and simultaneously, guides the material to the ground pad 114 to be brought into contact with the ground pad 114.

The above-described EMI shielding structure 100 has the shielding member 140 formed by injecting a conductive material having fluidity onto the top surface of the insulation molding member 120, thereby shielding the top surface of the insulation molding member 120. Hereinafter, a structure for shielding by attaching a shielding member 140 of a film type to the top surface of the insulation molding member 120 will be described.

Figure 7:
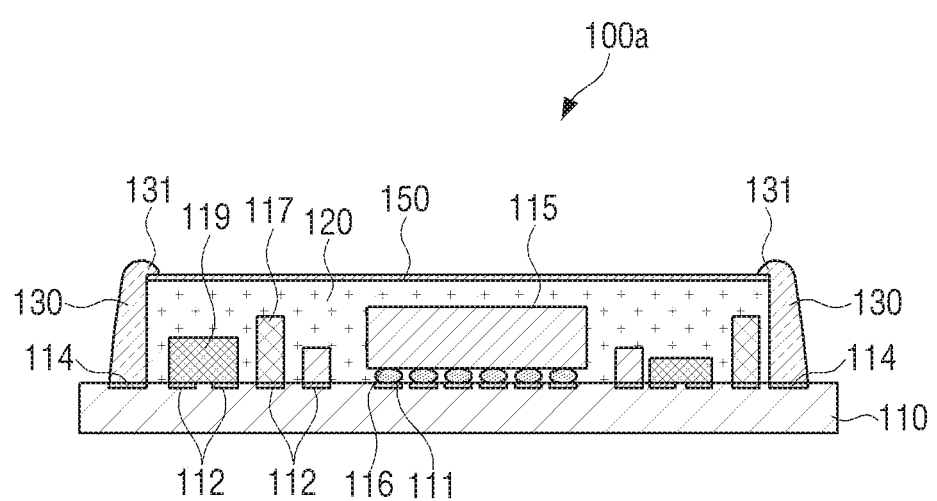
FIG. 7 is a cross section view illustrating an EMI shielding structure according to an embodiment of the present disclosure.

FIG. 7 is a cross section view illustrating an EMI shielding structure according to an embodiment of the present disclosure.

FIGS. 8A to 8F are views illustrating a process of an EMI shielding structure illustrated in FIG. 7 according to various embodiments of the present disclosure.

Referring to FIG. 7, an EMI shielding structure 100a has the insulation molding member 120 formed using the mold 10 in the same method as in the above-described EMI shielding structure 100, and slightly differs from the above-described EMI shielding structure 100 in that a conductive shielding film 150 is used and the shielding dam 130 is formed after the conductive shielding film 150 is formed.

Hereinafter, a manufacturing process of the EMI shielding structure 100a according to an embodiment will be described in sequence with reference to FIGS. 8A to 8F.

Figure 8A:
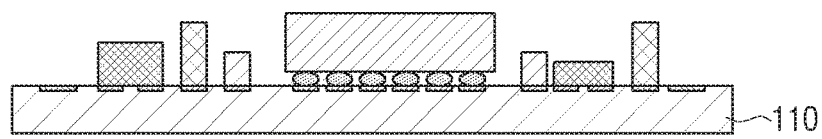
FIGS. 8A, 8B, 8C, 8D, 8E, and 8F are views illustrating a process of a EMI shielding structure illustrated in FIG. 7 according to various embodiments of the present disclosure.
Figure 8B:
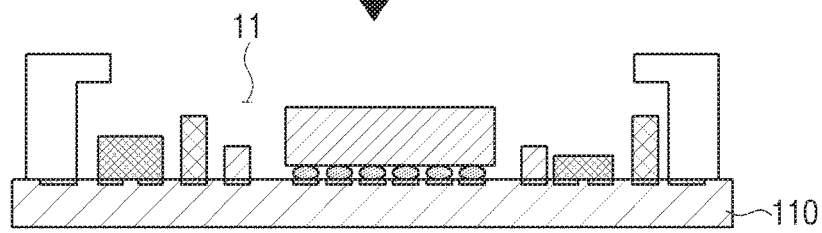

Referring to FIGS. 8A and 8B, when the PCB 110 on which the plurality of circuit elements are mounted is loaded into a work position, the mold 10 is arranged on a position of the PCB 110 where the insulation molding member 120 is to be formed as shown in FIG. 8B.

Figure 8C:
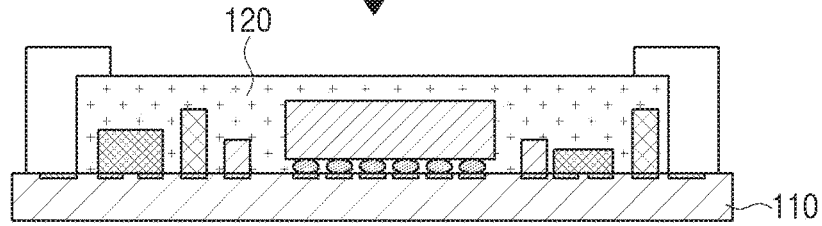

Referring to FIG. 8C, an insulation material having fluidity is injected into the inside 11 of the mold 10, and then the PCB 110 is put into an oven (not shown) and heated at a predetermined temperature during a predetermined time in order to cure the insulation material. The insulation material cured in the inside 11 of the mold 10 becomes the insulation molding member 120.

Figure 8D:
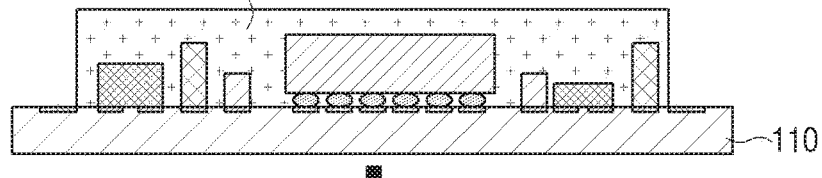

Referring to FIG. 8D, in response to the insulation molding member 120 being formed, the PCB 110 is drawn out from the oven and then the mold 10 is removed from the PCB 110.

Figure 8E:
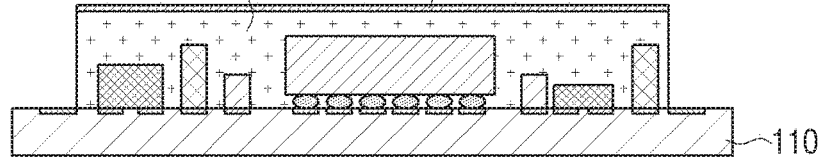
Figure 8F:
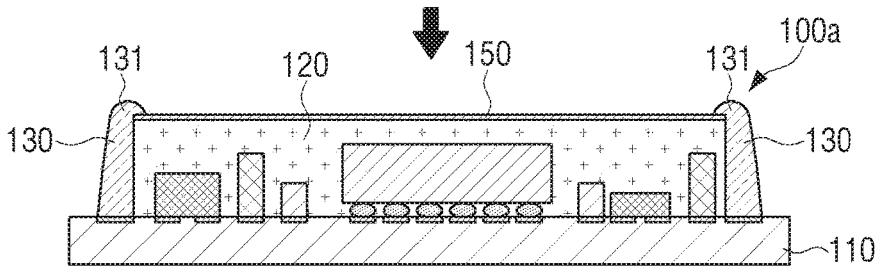

Referring to FIGS. 8E and 8F, the conductive shielding film 150 is attached to the top surface of the insulation molding member 120. In this case, the size of the conductive shielding film 150 may be the same as the size of the top surface of the insulation molding member 120. This is to realize complete shielding without generating a gap by making the upper end 131 of the shielding dam 130 overlap the upper portion of the conductive shielding film 150 in the post-process of forming the shielding dam 130. The size of the conductive shielding film 150 may be slightly smaller than the size of the top surface of the insulation molding member 120. In this case, it is necessary to form the upper end 131 of the shielding dam 130 to have a length so as to cover the edge of the conductive shielding film 150.

After the conductive shielding film 150 is attached to the top surface of the insulation molding member 120, the shielding dam 130 for covering the side surface of the insulation molding member 120 and a part (edge) of the conductive shielding film 150 is formed by the nozzle 216 continuously discharging a predetermined amount of conductive material while moving along the side portion of the insulation molding member 120.

Figure 9:
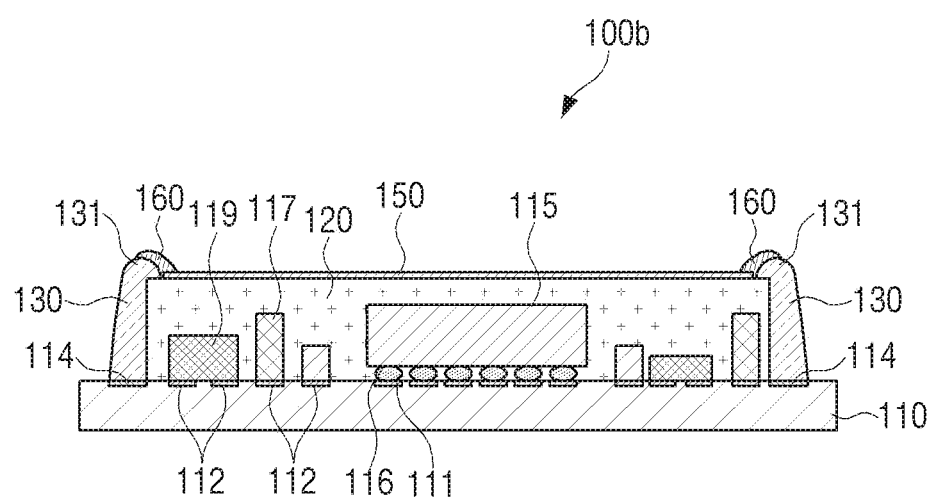
FIG. 9 is a cross section view illustrating an example of a shielding bridge for electrically connecting a shielding dam and a shielding film in an EMI shielding structure illustrated in FIG. 7 according to an embodiment of the present disclosure.

FIG. 9 is a cross section view illustrating an example of a shielding bridge for electrically connecting a shielding dam and a conductive shielding film in an EMI shielding structure of FIG. 7 according to an embodiment of the present disclosure.

Referring to FIG. 9, in an EMI shielding structure 100b when the size of the conductive shielding film 150 is smaller than the size of the top surface of the insulation molding member 120, the conductive shielding film 150 does not cover the edge of the top surface of the insulation molding member 120, causing a predetermined gap between the upper end 131 of the shielding dam 150 and the conductive shielding film 150. Therefore, electromagnetic waves may leak through this gap and the shielding efficiency may deteriorate.

In this case, in order fill the gap generated between the upper end 131 of the shielding dam 130 and the conductive shielding film 150, an edge bridge 160 may be formed to overlap the upper end 131 of the shielding dam 130 and the conductive shielding film 150 simultaneously. The edge bridge 160 may be formed of the same conductive material having fluidity as the material of the shielding dam 130. The material for forming the edge bridge 160 has fluidity, such that it can effectively fill the gap generated between the upper end 131 of the shielding dam 130 and the conductive shielding film 150.

The edge bridge 160 may electrically contact the shielding dam 130 and the conductive shielding film 150, and can prevent the shielding efficiency from deteriorating by covering the gap generated between the upper end 131 of the shielding dam 130 and the conductive shielding film 150.

Figure 10A:
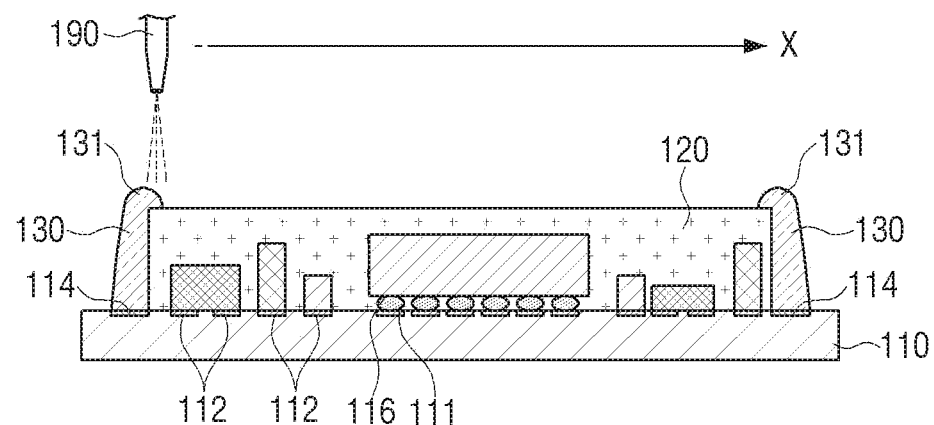
FIGS. 10A and 10B are schematic views illustrating an example of a process of coating a shielding member on a top surface of an insulation molding member according to various embodiments of the present disclosure.
Figure 10B:
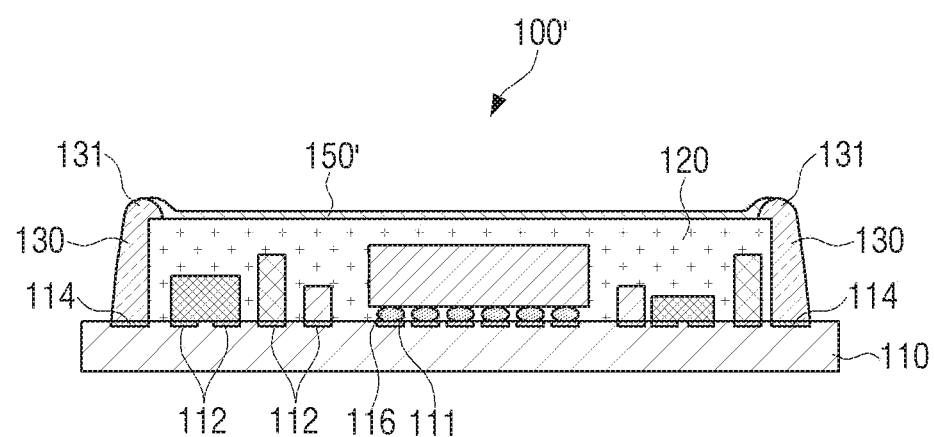

FIGS. 10A and 10B are schematic views illustrating an example of a process of coating a shielding member on a top surface of the insulation molding member according to various embodiments of the present disclosure.

Referring to FIGS. 10A and 10B, as described above, the conductive shielding film 150 may be attached to the top surface of the insulation molding member 120, but this should not be considered as limiting. The shielding member may be formed on the top surface of the insulation molding member in a coating method.

That is, the process of forming the insulation molding member 120 using the mold 10 and forming the shielding dam 130 on the side portion of the insulation molding member 120 to form an EMI shielding structure 100' is the same as the above-described process of forming the EMI shielding structure 100. After the shielding dam 130 is formed, as illustrated in FIG. 10B, a shielding member 150' having a predetermined thickness may be formed by spraying an electroconductive material onto the top surface of the insulation molding member 120 from a spray nozzle 190 by moving the spray nozzle 190 along the upper side of the insulation molding member 120 as illustrated in FIG. 10A.

In this case, the amount of material to be sprayed will be enough as long as it does not expose the insulation molding member 120.

When the electroconductive material is sprayed, the electroconductive material may be sprayed to cover the upper portion of the shielding dam 130 and may not generate a gap between the shielding member 150' and the shielding dam 130, such that complete shielding can be realized.

In the above-described example, the shielding member 150' is coated after the shielding dam 130 is formed. However, this should not be considered as limiting. The shielding dam 130 may be formed after the shielding member 150' is coated on the top surface of the insulation molding member 120.

In addition, the shielding member 150' may be coated on the top surface of the insulation molding member 120 in various methods such as screen printing, ink jetting, or the like instead of the above-described spraying method.

Although not shown in the drawing, after the shielding member 150' is coated on the top surface of the insulation molding member 120, the shielding dam 130 may be formed along the side surface of the insulation molding member 120.

In this case, the viscosity of the material forming the shielding member 150' may be greater than or equal to about 10,000 cps so as to prevent the shielding member 150 from flowing down from the top surface of the insulation molding member 120.

Figure 11A:
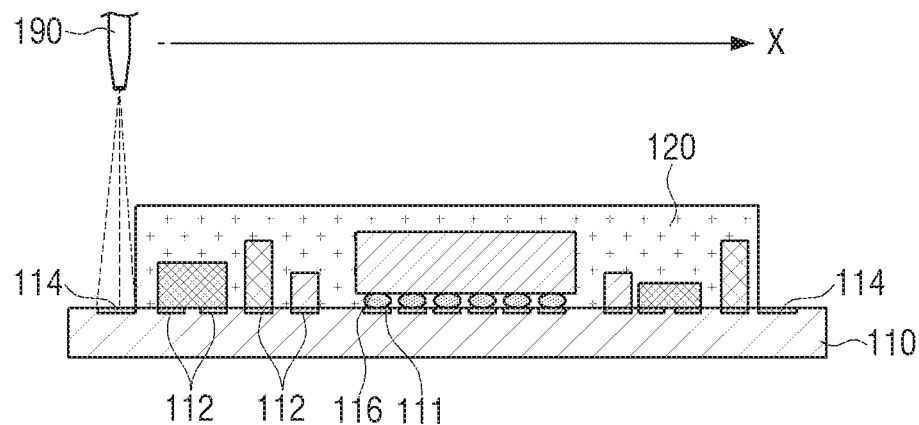
FIGS. 11A and 11B are schematic views illustrating an example of a process of forming a shielding dam and a shielding member in a coating method according to various embodiments of the present disclosure.
Figure 11B:
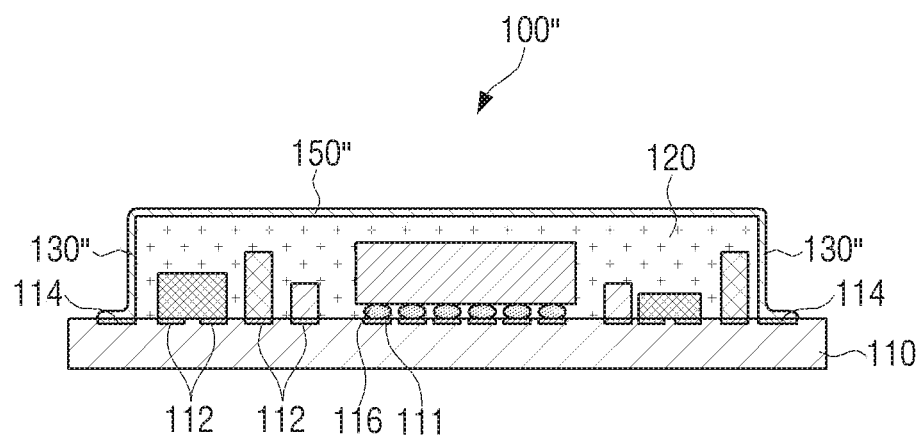

FIGS. 11A and 11B are schematic views illustrating an example of a process of forming a shielding dam and a shielding member in a coating method according to various embodiments of the present disclosure.

Referring to FIGS. 11A and 11B, the process of forming the insulation molding member 120 using the mold 10 to form an EMI shielding structure 100" is the same as the process of forming the above-described EMI structure 100. After the insulation molding member 120 is formed, a shielding dam 130" and a shielding member 150" may be formed along with each other as illustrated in FIG. 11B by spraying an electroconductive material onto the ground pad 114 and the side surface and the top surface of the insulation molding member 120 from the spray nozzle 190 while moving the spray nozzle 190 along the upper side of the insulation molding member 120 as illustrated in FIG. 11A. In this case, since the shielding dam 130" may be formed to have the same or similar thickness as or to the thickness of the shielding member 150", the shielding dam 130" may be thinner than the above-described shielding dam 130'.

Since the shielding dam 130" and the shielding member 150" are coated on the insulation molding member 120 in a single process through the spraying method, a processing time can be reduced and a gap is less likely to be generated between the shielding member 130" and the shielding dam 150".

In addition, the shielding dam 130" and the shielding member 150" may be coated on the top surface of the insulation molding member 120 in various typical methods such as screen printing, ink jetting, or the like instead of the above-described spraying method.

Figure 12A:
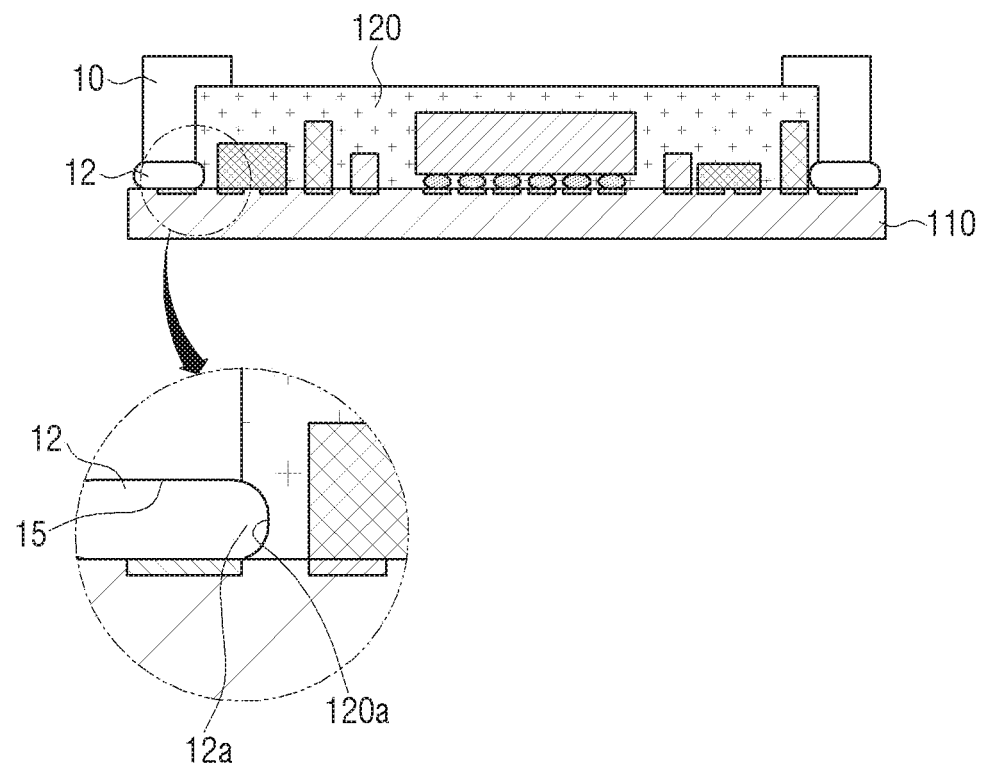
FIGS. 12A and 12B are views to illustrate a phenomenon which may occur in an insulation molding member when the insulation molding member is formed by applying a sealing member of a rubber material to a lower end of a mold according to various embodiments of the present disclosure.
Figure 12B:
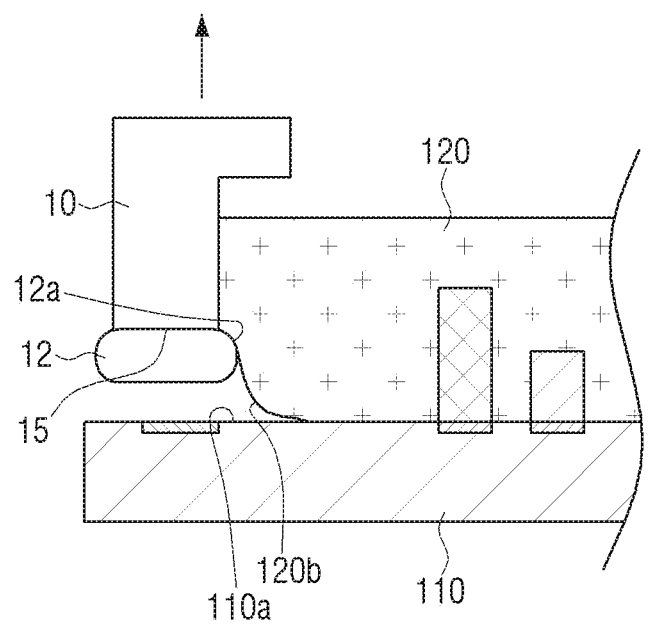

FIGS. 12A and 12B are views to illustrate a phenomenon which may occur in an insulation molding member when the insulation molding member is formed by applying a sealing member of a rubber material to the lower end of the mold according to various embodiments of the present disclosure.

Referring to FIGS. 12A and 12B, n the process of forming the insulation molding member 120 on the PCB 110, when a lower end 15 of the mold 10 is not completely in close contact with the top surface of the PCB 110, the insulation material injected into the inside 11 of the mold 10 may leak through a gap formed between the lower end 15 of the mold 10 and the top surface of the PCB 110.

In order to prevent this, a sealing member 12 made of a rubber material may be connected with the lower end 15 of the mold 10. In this case, since the sealing member 12 has elasticity, the sealing member 120 is brought into close contact with the top surface of the PCB 110 when the mold 10 is disposed on the PCB 110, such that the insulation material injected into the inside 11 of the mold 10 can be prevented from leaking to the outside.

However, when the sealing member 12 is used for long time, the elasticity may be reduced. Therefore, the sealing member 120 may be deformed to have its opposite sides protrude toward the inside and outside of the mold 10, respectively, as illustrated in FIG. 12A. The lower portion of the side surface of the insulation molding member 120 may be cured with a dented groove 120a being formed by a side portion 12a of the sealing member 12 protruding toward the inside 11 of the mold 10. However, when the side surface of the insulation molding member 120 is not formed flatways, it may be difficult to form the shielding dam 130 on the side portion of the insulation molding member 120 according to a predetermined width to height ratio. This may cause a defect in a product, such as a problem that a part of the conductive material discharged from the nozzle 216 by a predetermined amount to form the shielding dam 130 flows into the groove 120a, and thus the height of the shielding dam 130 is reduced, In addition, when the mold 10 is removed from the PCB 110 after the insulation molding member 120 is cured as illustrated in FIG. 12B, a part of the side surface of the insulation molding member 120 may be pulled in the direction of removing the mold 10 by the side portion 12a of the sealing member 12 protruding toward the inside 11 of the mold 10, and a lower portion 120b of the insulation molding member 120 may be separated from the top surface 110a of the PCB 110.

In order to prevent this problem, the deformed sealing member 120 should be replaced with a new sealing member 120, which causes an inconvenience. In addition, there is a problem that the process should be stopped while the sealing member 12 is replaced.

The present disclosure can solve the above-described problems which are accompanied by the application of the sealing member 12 of the rubber material to the mold 10 using a liquid sealant. The liquid sealant may substitute for the sealing member 12. Since the liquid sealant is evaporated after the insulation material injected into the mold 10 is completely cured, the liquid sealant does not deform the side surface of the insulation molding member 120. In addition, when the mold 10 is removed from the PCB 110 after the insulation molding member 120 is completely cured, the liquid sealant has been already evaporated and disappeared. Therefore, the liquid sealant does not influence the insulation molding member 120.

The liquid sealant should apply a material which does not blend with the liquid insulation material injected inside the mold 10, and should have good wettability (or spreadability) so as to be well coated on a lower end 15 of the mold 10 and not to be separated, should have low dispersibility to have a predetermined shape, and should be easily removed by a molding member curing condition or post-processing after the mold is removed, and should not leave a residue. To achieve this, the spreadability and dispersiblity of the liquid sealant on the surface of the PCB should be weaker than on the surface of the mold.

Herein, the spreadability of the liquid sealant refers to a property that can maintain the shape of continuous films formed by coating the liquid sealant on the lower end 15 of the mold 10. The dispersibility refers to a property that maintains the shape of the films in the form of a wall and prevents the shape of the films from being in a thin and wide coated shape. A unit for measuring the spreadability and the dispersibility may be a contact angle (an angle which is formed when the liquid is thermodynamically in equilibrium on the surface of the solid). In addition, the unit for measuring the spreadability and the dispersibility may be a surface tension of the liquid sealant or surface energy of the mold and the PCB.

In addition, the liquid sealant should have a boiling point higher than the curing temperature of the insulation material, such that the liquid sealant can be evaporated at the curing temperature of the insulation material and removed. This is because, when the boiling point of the liquid sealant is close to the curing temperature of the insulation material, bubbles may be generated by boiling while the insulation material is cured and thus there is a high probability that defects are caused. In addition, the liquid sealant should have low steam pressure at room temperature, should have a slower evaporation speed than the curing speed of the insulation molding member 120, and should be formed of a material which does not melt or change the insulation molding member.

The liquid sealant satisfying the above-described conditions may apply a single material or a mixed material based on water. When the liquid sealant is a single material, the liquid sealant may be diethylene glycol monobutyl ether, diethylene glycol diethyl ether, ethylene glycol monobutyl ether, triethylene glycol monobutyl ether, diethylene glycol monomethyl ether, ethylene glycol monomethyl ether, triethylene glycol monomethyl ether, or the like.

When the liquid sealant is a mixed material, the liquid sealant may be based on water and may use, as an additive for controlling wettability, methoxy propanol, isopropyl alcohol (IPA), ethanol, methanol, anionic surfactant, cationic surfactant, nonionic surfactant, or the like, and may use, as an additive for controlling volatility, glycerin, ethylene glycol, diethylene glycol, triethylene glycol, propylene glycol, dipropylene glycol, hexylene glycol, 1,3-butanediol, 1,4-butanediol, 1,5-pentanediol, 2-butene-1, 4-diol, 2-metyle-2-pentanediol, or the like.

The liquid sealant may be composed by mixing water and the additive for controlling the wettability. In addition, the liquid sealant may be composed by mixing water, the additive for controlling the wettability, and the additive for controlling the volatility. A composition ratio of the liquid sealant may be set variously according to materials.

Hereafter, a process of forming the insulation molding member 120 using the liquid sealant according to various embodiments will be described.

Figure 13:
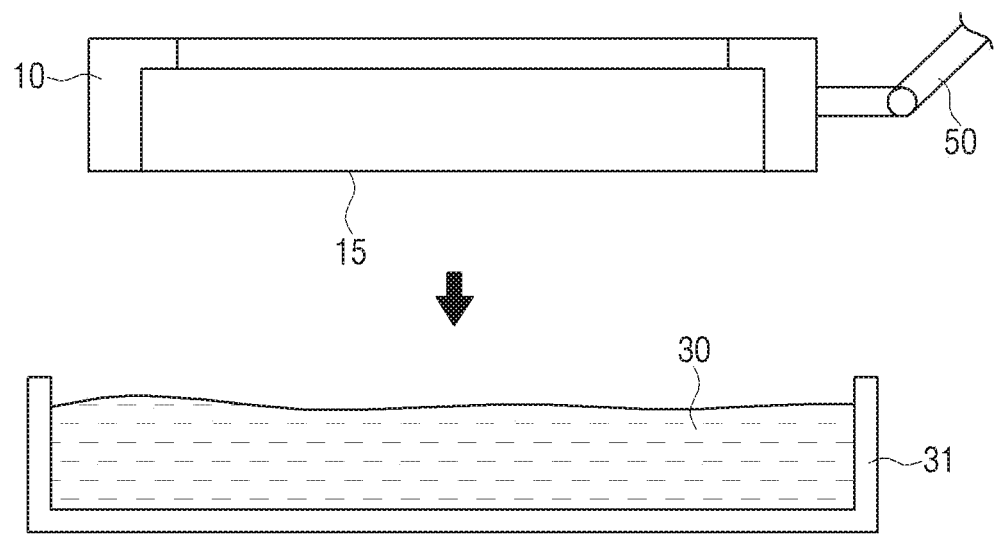
FIG. 13 is a view illustrating a mold which is moved to a tray filled with a liquid sealant to have its lower end coated with the liquid sealant according to an embodiment of the present disclosure.

FIG. 13 is a view illustrating a mold which is moved to a tray filled with a liquid sealant to have its lower end coated with the liquid sealant according to an embodiment of the present disclosure.

FIGS. 14A to 14E are views illustrating a process of manufacturing an EMI shielding structure by evaporating a liquid sealant according to various embodiments of the present disclosure.

Referring to FIG. 13, the mold 10 may be connected to a robot arm 50 (or gripped by the robot arm 50) and moved to a tray 31 filled with a liquid sealant 30 and a molding position for forming the insulation molding member 120 on the PCB. The mold 10 may be moved to the upper side of the tray 31 by the robot arm 50 prior to being seated on the PCB 110 and then descend to have the lower end 15 of the mold 10 coated with the liquid sealant 30.

Figure 14B:
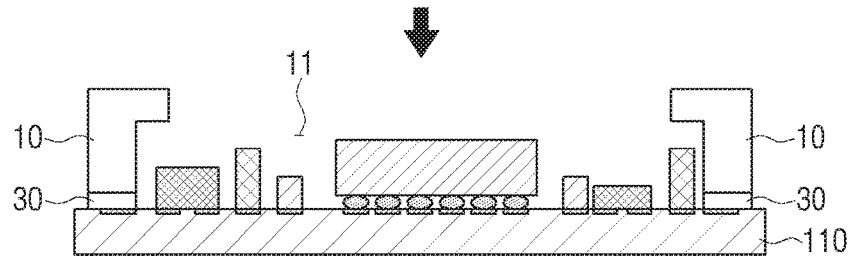
Figure 14C:
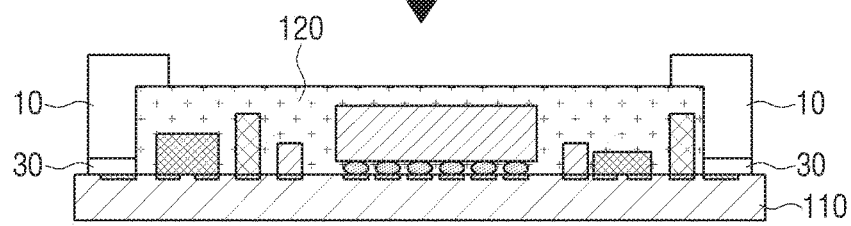

Referring to FIGS. 14A to 14E, after the mold 10 is moved to the molding position by the robot arm 50 with the lower end 15 being coated with the liquid sealant 30 as illustrated in FIG. 14A, the mold 10 is seated on the PCB 110 as illustrated in FIG. 14B. Since the liquid sealant 30 closely contacts the surface of the PCB 110, the insulation material injected into the inside of the mold 10 as illustrated in FIG. 14C does not leak between the mold 10 and the PCB.

Figure 14D:
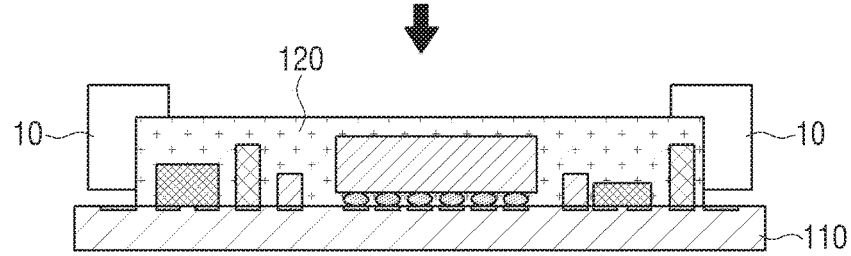

In response to the PCB 110 being set to a predetermined temperature after the insulation material is injected inside the mold 10 and the PCB 110 is put into an oven, the insulation material is cured at a first temperature. In response to the temperature in the oven increasing to an evaporation temperature of the liquid sealant, which is higher than the curing temperature of the insulation material, the liquid sealant 30 is evaporated. Accordingly, the liquid sealant 30 disappears between the mold 10 and the PCB 110 and an empty space is formed as illustrated in FIG. 14D.

Figure 14E:
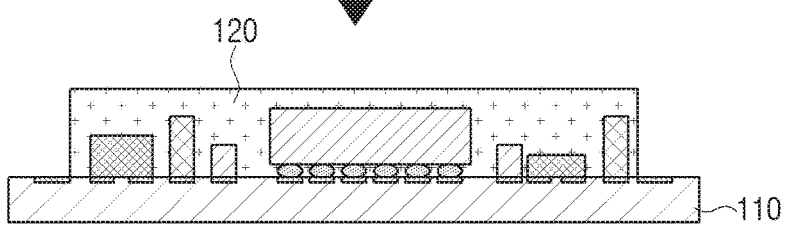

In this state, in response to the mold 10 being removed from the PCB 110 as illustrated in FIG. 14E, the insulation molding member 120 may be formed with the flat side surface by the mold 10 or the sealing member 12 without being damaged. Although a subsequent process is not illustrated, after the mold 10 is removed as described above, the shielding dam 130 may be formed along the side portion of the insulation molding member 120 by driving the nozzle 216 (see FIG. 2E), and then, the shielding member 140 may be formed by injecting a conductive material onto the top surface of the insulation molding member 120 (see FIG. 2F).

After the mold 10 is removed from the PCB 110 as illustrated in FIG. 14E, as described above the shielding film 150 may be attached to the top surface of the insulation molding member 120 (see FIG. 8E), and the shielding dam 130 may be formed along the side portion of the insulation molding member 120 by driving the nozzle 216 (see FIG. 8F).

FIGS. 15A to 15E are views illustrating a process of manufacturing an EMI shielding structure by removing a liquid sealant through post-processing according to various embodiments of the present disclosure.

Figure 15B:
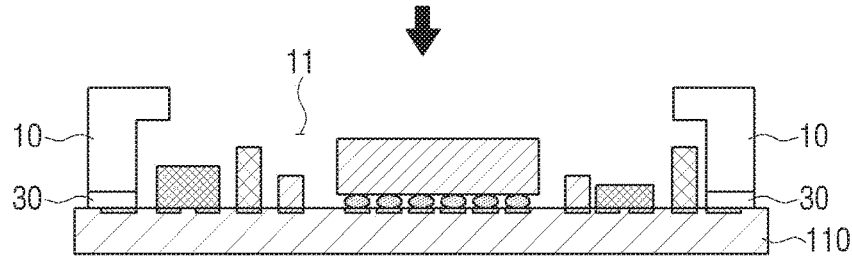
Figure 15C:
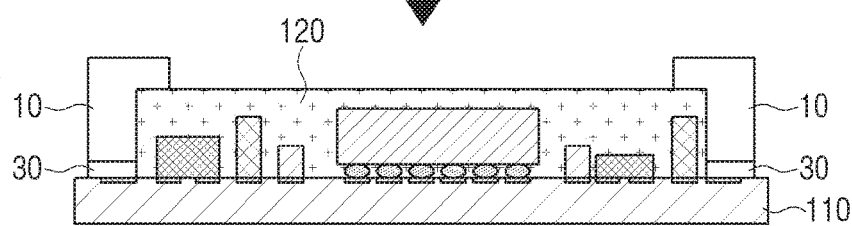

Since the processes in FIGS. 15A to 15C are the same as the processes in FIGS. 14A to 14C in the above-described various embodiments, a description thereof is omitted and subsequent processes will be described.

Figure 15D:
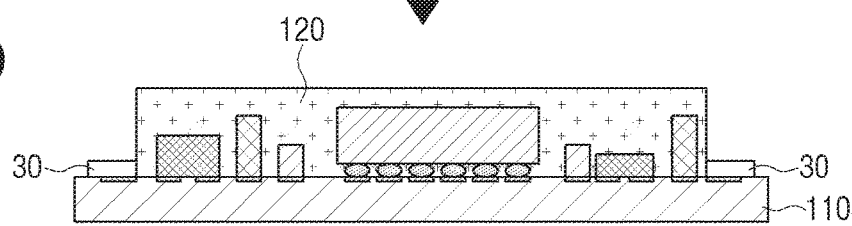

Referring to FIG. 15D, the liquid sealant 30 may be formed of a material which is not evaporated in the process of curing the insulation mold member 120 in the oven.

Figure 15E:
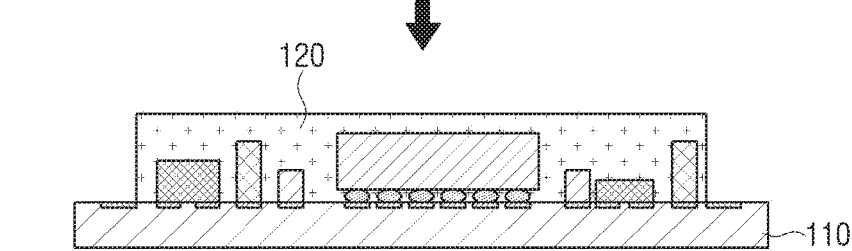

Referring to FIG. 15E, after the mold 10 is removed from the PCB 110, the liquid sealant 30 may be completely removed from the PCB 110 by scraping the liquid sealant 30 using a predetermined peeling tool.

In this case, the liquid sealant 30 remaining on the PCB 110 may be removed by heating at a high temperature without using the peeling tool. Specifically, the liquid sealant 30 remaining on the PCB 110 may be removed by heating in a temperature range between the curing temperature of the insulation molding member 120 and the boiling point of the liquid sealant 30 or a temperature range between the curing temperature of the insulation molding member 120 and a heat resistance temperature of the insulation molding member 120. In this case, a processing condition may be setting a change in temperature of a curing furnace (not shown) in two steps, the curing temperature of the insulation molding member 120 and a temperature higher than the curing temperature, for evaporating and removing the liquid sealant 30.

FIGS. 16A to 16F are views illustrating a process of manufacturing an EMI shielding structure to explain an example by injecting a liquid sealant between a mold and a PCB after the mold is set according to various embodiments of the present disclosure.

Figure 16A:
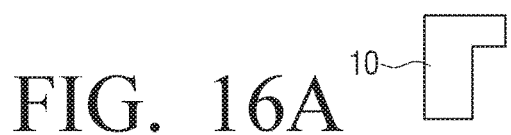
FIGS. 16A, 16B, 16C, 16D, 16E, and 16F are views illustrating a process of manufacturing an EMI shielding structure by injecting a liquid sealant between a mold and a PCB after the mold is set according to various embodiments of the present disclosure.
Figure 16B:
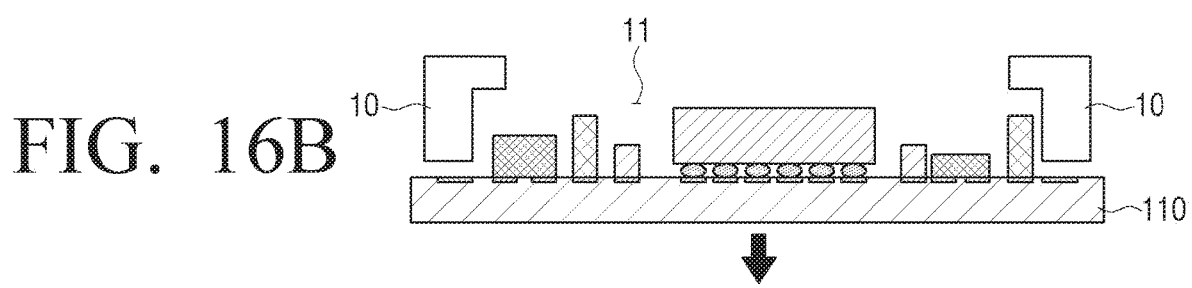
Figure 16C:
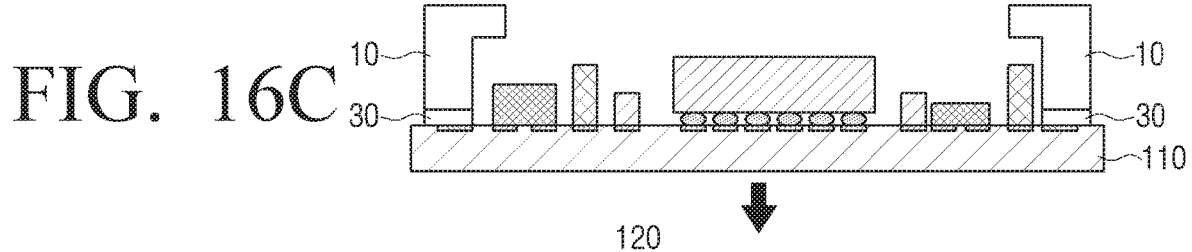
Figure 16D:
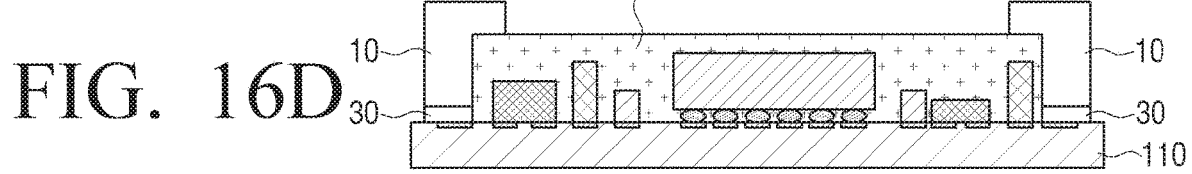

Referring to FIGS. 16A to 16F, the mold 10 is moved to a molding position as illustrated in FIG. 16B without having the lower end 15 coated with the liquid sealant 130 as illustrated in FIG. 16A. In this case, the mold 10 may be supported by the robot arm 50 and spaced from the PCB 110 over the PCB 110 by a predetermined distance. The liquid sealant 130 is injected into a space between the mold 10 and the PCB 110 as illustrated in FIG. 16C. In response to the liquid sealant 30 being completely injected, an insulation material is injected into the inside of the mold 10 as illustrated FIG. 16D. In this case, the insulation material does not leak between the mold 10 and the PCB due to the liquid sealant 30.

Figure 16E:
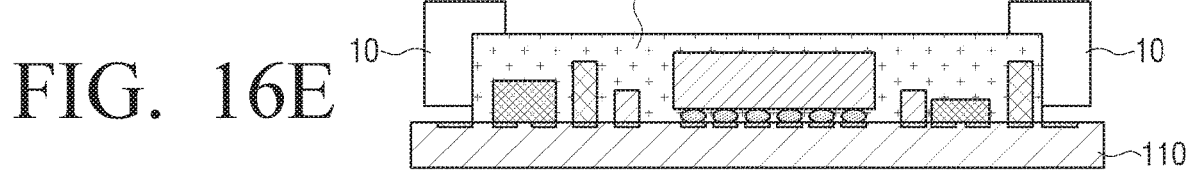

In response to the PCB 110 being set to a predetermined temperature after the insulation material is injected inside the mold 10 and the PCB 110 is put into an oven, the insulation material is cured at the predetermined temperature, and the liquid sealant 30 is gradually evaporated at the curing temperature. Alternatively, in response to the temperature in the oven increasing to an evaporation temperature of the liquid sealant, which is higher than the curing temperature of the insulation material, the liquid sealant 30 is evaporated. Accordingly, the liquid sealant 30 disappears between the mold 10 and the PCB 110 and an empty space is formed as illustrated in FIG. 16E.

Figure 16F:
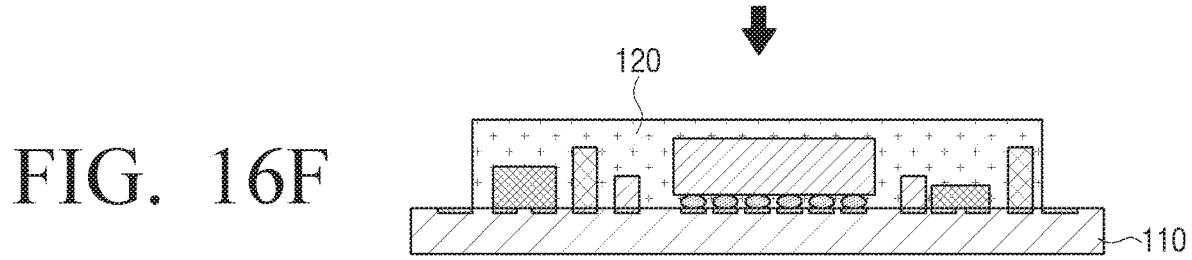

In this state, in response to the mold 10 being removed from the PCB 110 as illustrated in FIG. 16F, the insulation molding member 120 may be formed with the flat side surface by the mold 10 or the sealing member 12 without being damaged.

FIGS. 17A to 17F are views illustrating a process of manufacturing an EMI shielding structure by injecting a liquid sealant between a mold and a PCB after the mold is set and removing the liquid sealant through post-processing according to various embodiments of the present disclosure.

Since the processes in FIGS. 17A to 17D are the same as the processes in FIGS. 16A to 16D in the above-described various embodiments, a description thereof is omitted and subsequent processes will be described.

Figure 17A:
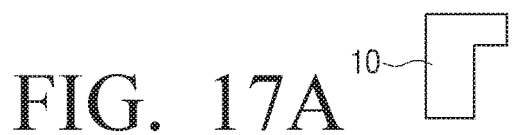
FIGS. 17A, 17B, 17C, 17D, 17E, and 17F are views illustrating a process of manufacturing an EMI shielding structure by injecting a liquid sealant between a mold and a PCB after the mold is set and removing the liquid sealant through post-processing according to various embodiments of the present disclosure.
Figure 17B:
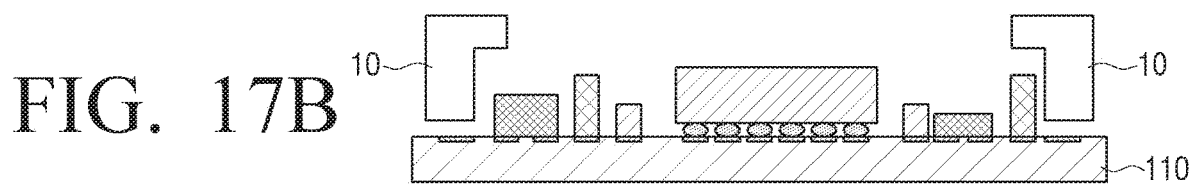
Figure 17C:
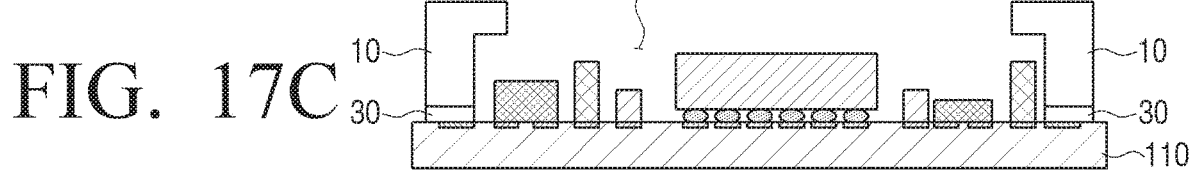
Figure 17D:
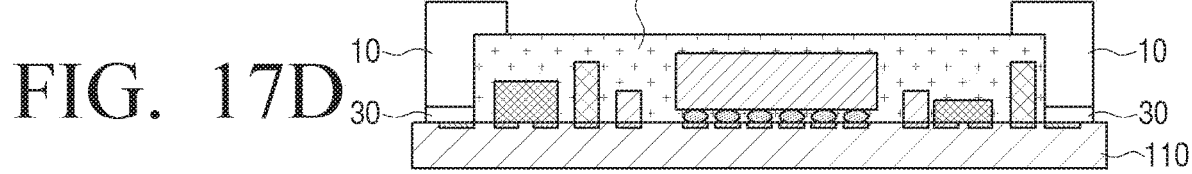
Figure 17E:
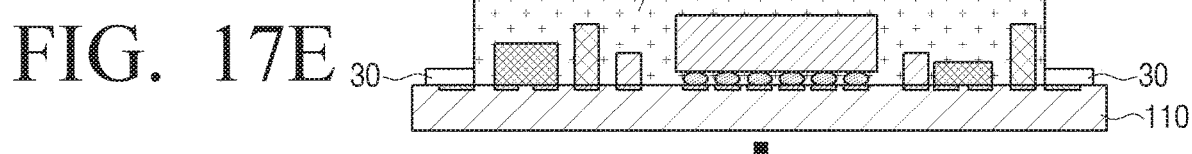

Referring to FIG. 17E, the liquid sealant 30 may be formed of a material which is not evaporated in the process of curing the insulation mold member 120 in the oven.

Figure 17F:
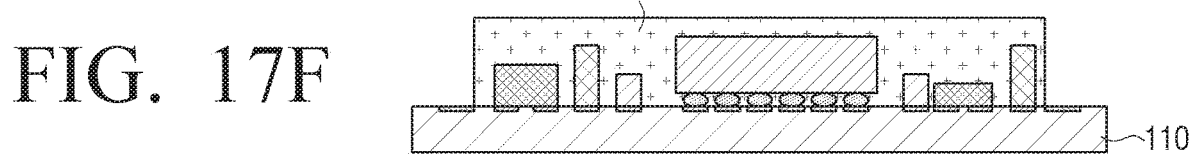

Referring to FIG. 17F, after the mold 10 is removed from the PCB 110, the liquid sealant 30 may be completely removed from the PCB 110 by scraping the liquid sealant 30 using a predetermined peeling tool.

FIGS. 18A to 18C are views illustrating a process of manufacturing an EMI shielding structure by controlling the height of an insulation molding member differently by controlling an amount of insulation material to be injected into a mold when a plurality of shielding structures are formed according to various embodiments of the present disclosure.

Referring to FIG. 18A, three molds 10-1, 10-2, and 10-3 are arranged on the PCB 110. In this case, the circuit elements mounted in shielding areas may have different heights, and a different amount of insulation material is injected into each mold 10-1, 10-2, and 10-3 with reference to the maximum height of the circuit elements mounted in each shielding area. That is, the amount of insulation material to be injected into the mold 10-1 disposed on the left side is larger than the amount of insulation material to be injected into the mold 10-2 disposed on the center, but is smaller than the amount of insulation material to be injected into the mold 10-3 disposed on the right side. In this case, the three molds 10-1, 10-2, and 10-3 may be integrally formed with one another and may be moved by a single robot arm 50 simultaneously.

In response to the different amount of insulation material being completely injected into each mold 10-1, 10-2, and 10-3, the PCB 110 is put into an oven and insulation molding members 120-1, 120-2, and 120-3 are formed by curing the insulation material. In this process, the liquid sealant 30 is evaporated, but, when the liquid sealant 30 is formed of a material which is not evaporated, the liquid sealant 30 may be removed from the PCB 110 using a tool after the molds 10-1, 10-2, and 10-3 are removed.

Referring to FIGS. 18B and 18C, in response to the insulation molding members 120-1, 120-2, and 120-3 of different heights being formed, shielding dams 130-1, 130-2, and 130-3 may be formed along the side portions of the insulation molding members 120-1, 120-2, and 120-3. In this case, the shielding dams 130-1, 130-2, and 130-3 may be formed to have different heights according to the heights of the insulation molding members 120-1, 120-2, and 120-3. The shielding dams 130-1, 130-2, and 130-3 are formed using nozzles having guide portions of different lengths according to the lengths of the shielding dams 130-1, 130-2, and 130-3.

After the shielding dams 130-1, 130-2, and 130-3 are formed, shielding members 140-1, 140-2, and 140-3 may be formed by filling the top surfaces of the insulation molding members 120-1, 120-2, and 120-3 with a conductive material. According to the present various embodiments, there is an advantage that the plurality of shielding structures are manufactured simultaneously.

In the above-described various embodiments, the insulation molding member is used using the mold and the shielding dam and the shielding member are formed after the mold is removed. Hereinafter, a process of forming a part of the shielding structure without removing the mold according to various embodiments will be described.

FIGS. 19A to 20E are views illustrating a process of manufacturing an EMI shielding structure by including a mold in the EMI shielding structure without removing the mold according to various embodiments of the present disclosure.

Referring to FIG. 19A, a sealant 30' is connected to the lower end of the mold 10. Since the sealant 30' is not removed from the mold 10, the sealant 30' does not have to be a liquid material which can be evaporated and may be a solid sealant having elasticity.

Figure 19B:
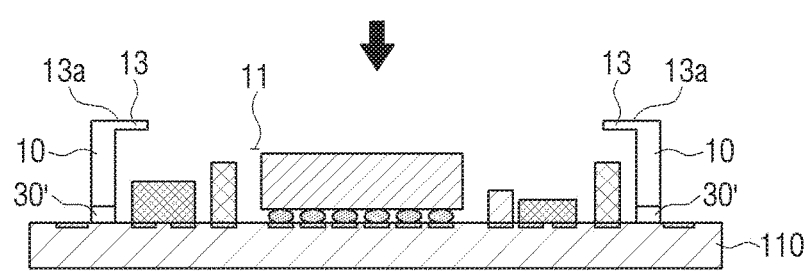

Referring to FIG. 19B, the mold 10 is moved to a molding position by the robot arm 50 and then seated on the PCB 110. The sealant 30' may be brought into close contact with the surface of the PCB 110 due to the elasticity.

Figure 19C:
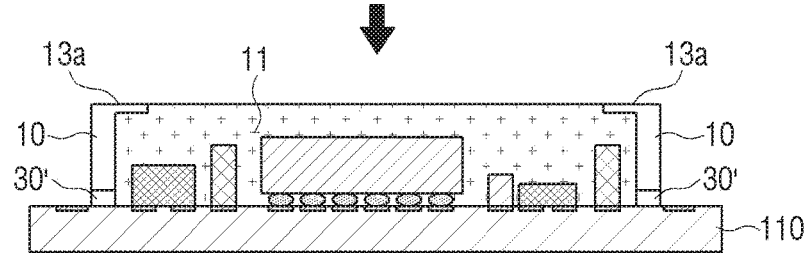

Referring to FIG. 19C, in the state in which the sealant 30' is in close contact with the PCB 110, the insulation molding member 120 is formed by injecting an insulation material into the inside of the mold 10. In this case, the liquid insulation material has fluidity but does not leak between the mold 10 and the PCB 110 due to the sealant 30'. The insulation material injected into the mold 10 is filled up to a top surface 13a of the mold 10 by adjusting the amount of injection, and is cured.

Figure 19D:
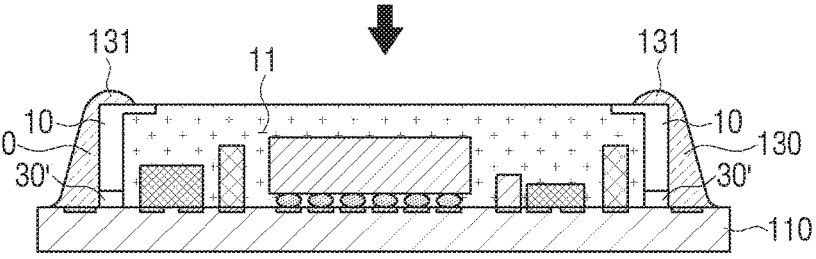

Referring to FIG. 19D, the shielding dam 130 is formed along the side portion of the insulation molding member 120 by driving the nozzle 216 (see FIG. 2E). In this case, the upper end 131 of the shielding dam 130 may be formed to cover the top surface 13a of the mold 10.

Figure 19E:
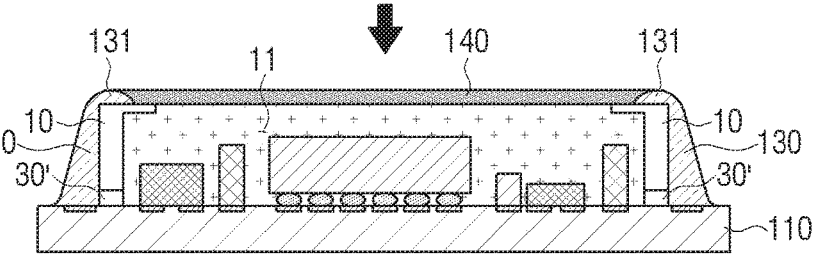

Referring to FIG. 19E, the shielding member 140 is formed by discharging an electroconductive material to the top surface of the mold 10 and the top surface of the insulation molding member 120, and then is cured. In this case, the electroconductive material discharged from the nozzle is discharged by a predetermined amount such that the electroconductive material does not flow over the upper end 131 of the shielding dam 130.

As described above, the mold 10 may be used as a single component forming the shielding structure without being removed in the process. In this case, the mold 10 may be formed of an electroconductive material or an insulation material.

FIGS. 20A to 20E illustrate embodiments in which a shielding structure is formed without removing a mold according to the various embodiments of FIGS. 19A to 19E.

Figure 20B:
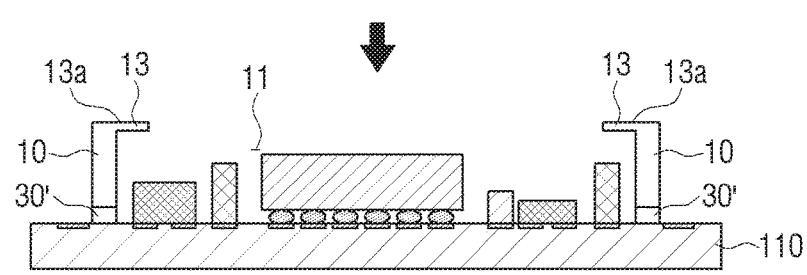

Referring to FIGS. 20A and 20B, the mold 10 having the sealant 30' connected to the lower end thereof as illustrated in FIG. 20A is moved to a molding position by the robot arm 50 and then seated on the PCB 110 as illustrated in FIG. 20B.

In this state, the insulation molding member 120 is formed by injecting an insulation material into the inside of the mold 10 and curing the insulation material.

Figure 20C:
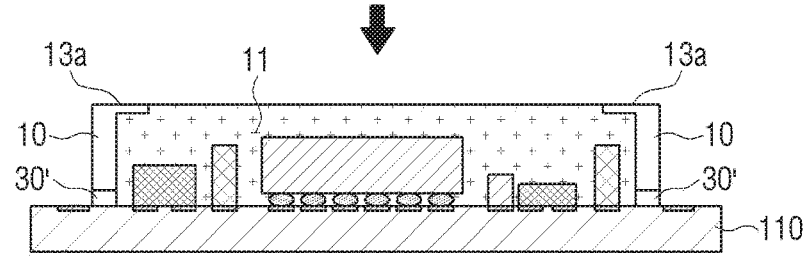
Figure 20D:
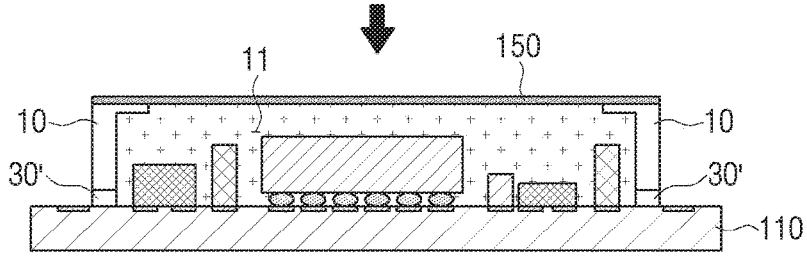
Figure 20E:
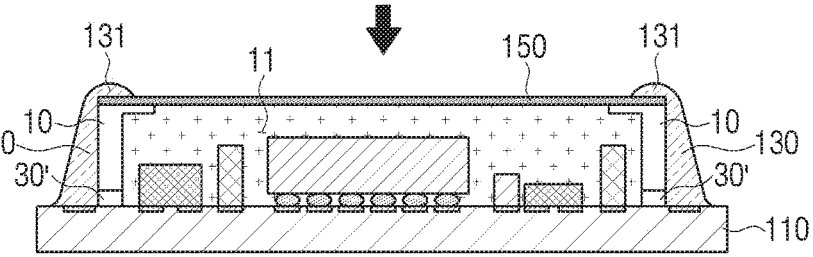

Referring to FIG. 20C to 20E, an electroconductive shielding film 150 is attached to the top surface of the mold 10 and the top surface of the insulation molding member 120 as shown in FIG. 20D, and then the shielding dam 130 is formed along the side portion of the insulation molding member 120 by driving the nozzle 216 as shown in FIG. 20E. In this case, the upper end 131 of the shielding dam 130 may cover the edge of the top surface of the electroconductive shielding film 150 and may be electrically connected with the electroconductive shielding film 150.

Figure 21:
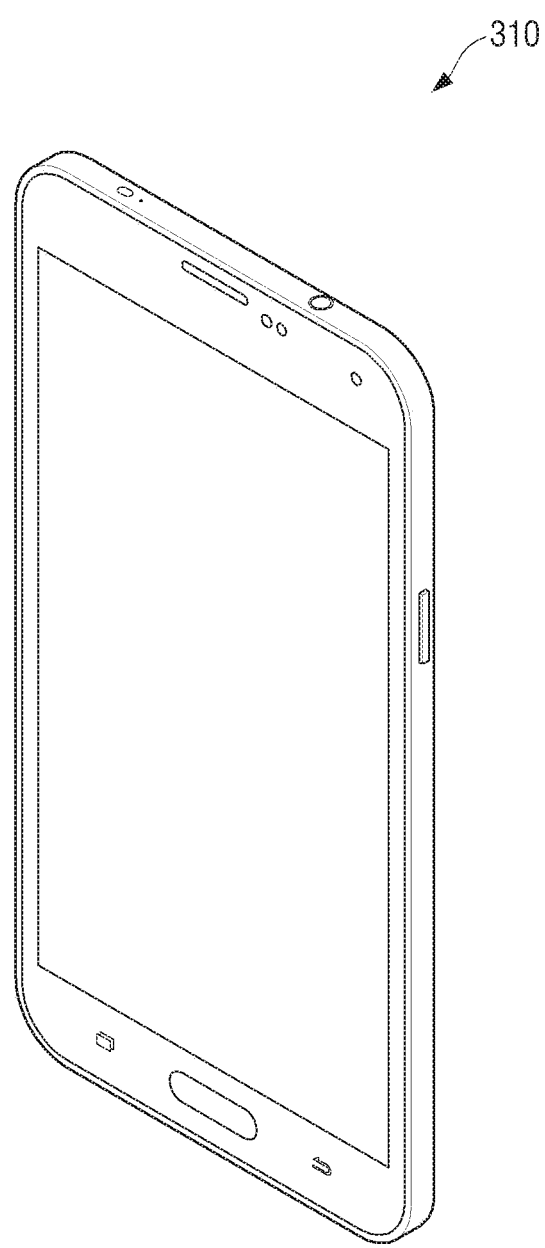
FIG. 21 is a perspective view illustrating a mobile phone terminal to which an EMI shielding structure according to an embodiment of the present disclosure.

FIG. 21 is a perspective view illustrating a mobile phone terminal to which an EMI shielding structure according to an embodiment of the present disclosure.

Figure 22:
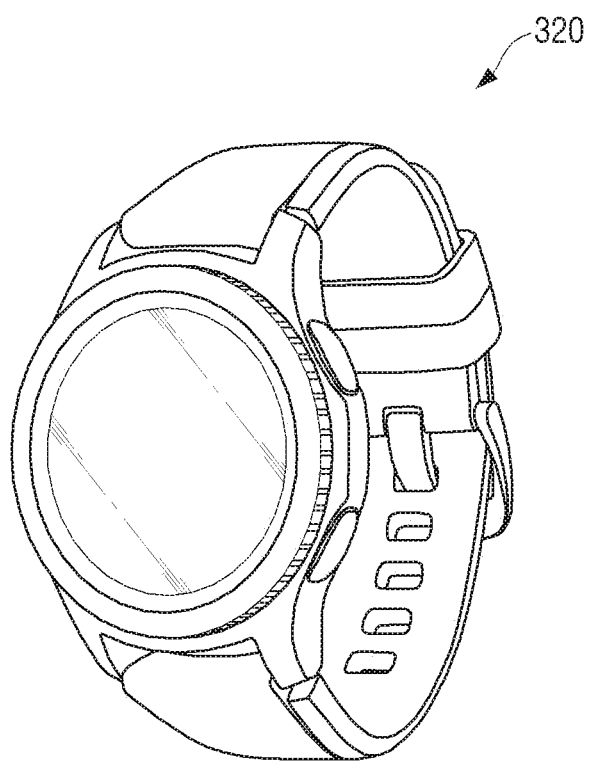
FIG. 22 is a perspective view illustrating a smart watch having an EMI shielding structure according to an embodiment of the present disclosure.

FIG. 22 is a perspective view illustrating a smart watch having an EMI shielding structure according to an embodiment of the present disclosure.

Referring to FIGS. 21 and 22, the EMI shielding structures having the above-described various structures can be applied to various electronic devices. That is, the EMI shielding structure may be installed in a smart phone 310 as illustrated in FIG. 21 or may be installed in a smart watch 320 as illustrated in FIG. 22.

While the present disclosure has been illustrated and described with reference to various embodiments thereof, it will be understood by those skilled in the art that various changes in form and details may be made therein without departing from the spirit and scope of the present disclosure as defined by the appended claims and their equivalents.

What is claimed is:

1. A method for manufacturing an electromagnetic interference (EMI) shielding structure, the method comprising:
coating a lower end of a mold with a liquid sealant to bring the liquid sealant into direct contact with the mold, the liquid sealant configured to evaporate at a predetermined temperature;
setting the mold to bring the liquid sealant into direct contact with a surface of a printed circuit board (PCB) on which a circuit element is mounted;

forming an insulation molding member for covering the circuit element by injecting an insulation material into the mold;

removing the mold from the PCB upon evaporation of the liquid sealant between the mold and the PCB; and forming a conductive shielding material for covering the insulation molding member.

2. The method of claim 1, wherein the forming of the insulation molding member comprises:

curing the insulation molding member at a first temperature; and evaporating the liquid sealant at a second temperature which is higher than the first temperature.

3. The method of claim 1, wherein the forming of the insulation molding member comprises:

curing the insulation molding member at a predetermined temperature; and curing the insulation molding member and evaporating the liquid sealant at the predetermined temperature by applying the liquid sealant which has an evaporation speed slower than a curing speed of the insulation molding member at the predetermined temperature.

4. The method of claim 1, wherein the liquid sealant is formed of:

a material which has a boiling point of a temperature higher than a curing temperature of the material forming the insulation molding member; or a material which has a boiling point of a same temperature as the curing temperature of the material forming the insulation molding member.

5. The method of claim 1, wherein the insulation material forming the insulation molding member is a material which does not physically blend with the liquid sealant.

6. The method of claim 1, wherein, after the coating of the lower end of the mold with the liquid sealant, the method further comprises forming a shielding dam along a side surface of the insulation molding member.

* * * * *